(12) United States Patent
Morii et al.

(10) Patent No.: US 7,006,598 B2
(45) Date of Patent: Feb. 28, 2006

(54) IMAGING METHOD AND APPARATUS WITH EXPOSURE CONTROL

(75) Inventors: Toshiko Morii, Kanagawa (JP); Masakazu Morishita, Kanagawa (JP); Osamu Tsujii, Tochigi (JP); Minoru Watanabe, Saitama (JP); Takamasa Ishii, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/636,884

(22) Filed: Aug. 7, 2003

(65) Prior Publication Data

US 2004/0101100 A1    May 27, 2004

(30) Foreign Application Priority Data

Aug. 9, 2002 (JP) .............................. 2002-233956
Jan. 27, 2003 (JP) .............................. 2003-017808

(51) Int. Cl.
*H05G 1/42* (2006.01)
*H05G 1/64* (2006.01)

(52) U.S. Cl. ...................... 378/97; 378/98.7; 378/98.8; 250/370.07; 250/370.09; 250/370.11

(58) Field of Classification Search ................. 378/96, 378/97, 98.7, 98.8; 250/370.07, 370.09, 250/370.11
See application file for complete search history.

(56) References Cited

U.S. PATENT DOCUMENTS

| 5,164,583 | A |   | 11/1992 | Aichinger et al. |
| 5,331,166 | A |   | 7/1994 | Yamamoto et al. |
| 5,448,613 | A |   | 9/1995 | Haendle et al. |
| 5,751,783 | A |   | 5/1998 | Granfors et al. |
| 5,777,335 | A | * | 7/1998 | Mochizuki et al. ..... 250/370.11 |
| 5,877,501 | A | * | 3/1999 | Ivan et al. ............. 250/370.09 |
| 5,937,027 | A | * | 8/1999 | Thevenin et al. .......... 378/98.7 |
| 6,208,710 | B1 |   | 3/2001 | Nagai |
| 6,353,228 | B1 | * | 3/2002 | Itabashi ................. 250/370.11 |
| 6,515,286 | B1 | * | 2/2003 | Kuwabara .............. 250/370.11 |
| 2001/0028701 | A1 | * | 10/2001 | Schulz ........................ 378/97 |
| 2002/0101960 | A1 | * | 8/2002 | Nokita ....................... 378/154 |

FOREIGN PATENT DOCUMENTS

EP    1048268 A2 *   11/2000

OTHER PUBLICATIONS

U.S. Appl. No. 10/648,916, filed Aug. 27, 2003, Ishii et al.

* cited by examiner

*Primary Examiner*—Edward J. Glick
*Assistant Examiner*—Chih-Cheng Glen Kao
(74) *Attorney, Agent, or Firm*—Morgan & Finnegan, LLP

(57) ABSTRACT

According to a radiation imaging apparatus, any separate AEC sensor need not be prepared. Additionally, the apparatus main body can be made compact. To accomplish this, the radiation imaging apparatus has a first optical conversion element that converts incident radiation into an electrical signal, and generates image information on the basis of the electrical signal output from the first optical conversion element. Below a portion that is aligned to the gap between the first optical conversion elements, a plurality of second optical conversion elements which detect the incident amount of the radiation from the gap are formed. Exposure control for the radiation or control of the optical conversion elements is executed on the basis of the detection result by the second optical conversion element.

20 Claims, 36 Drawing Sheets

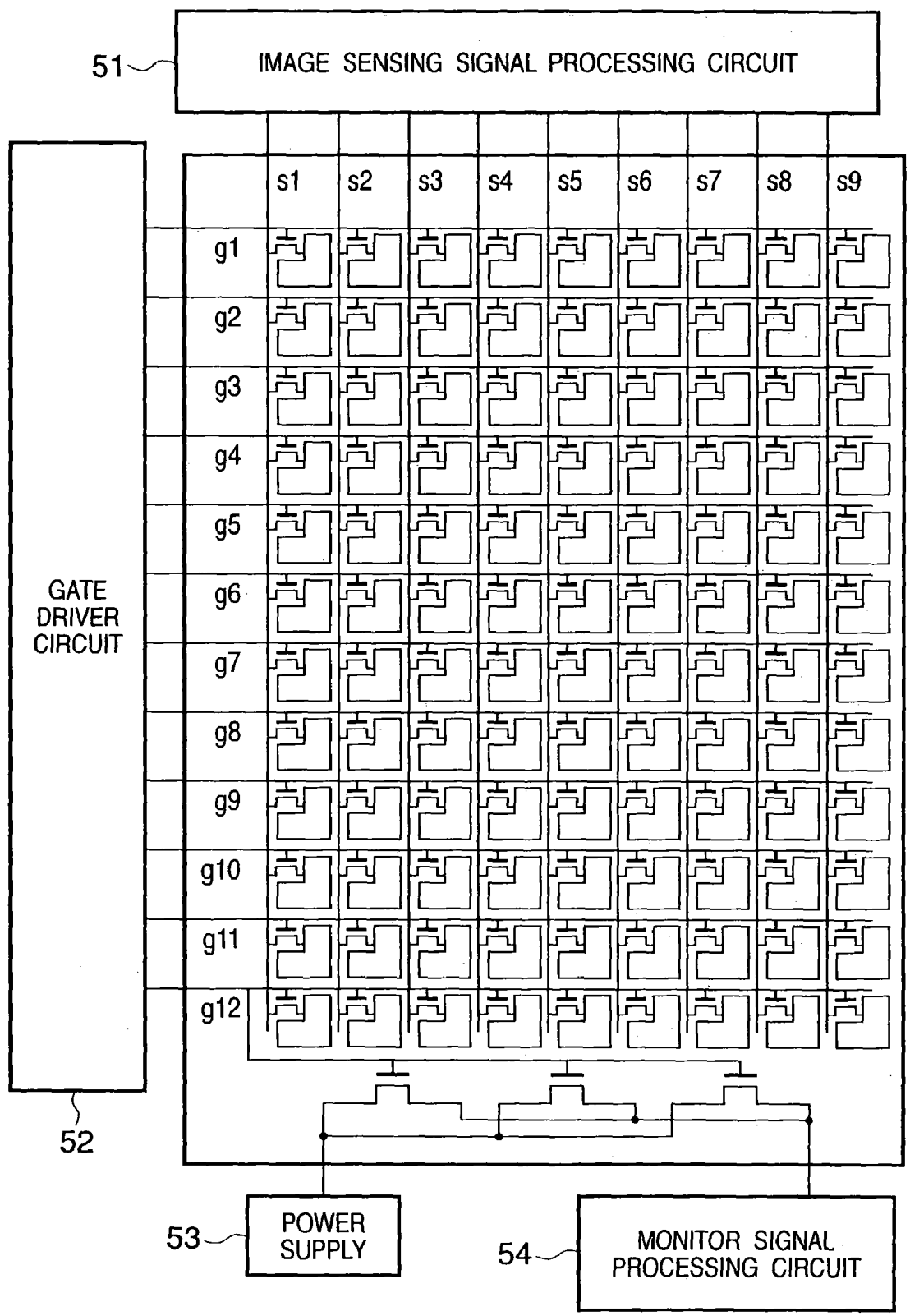

IMAGING METHOD AND APPARATUS WITH EXPOSURE CONTROL

FIELD OF THE INVENTION

The present invention relates to a radiation imaging apparatus applicable to an imaging apparatus which causes an image sensor to convert incident radiation into an electrical signal to generate image information and also causes an AEC sensor to detect the incident amount of the radiation to execute exposure control for the radiation, a method of manufacturing the radiation imaging apparatus, and an imaging circuit board.

BACKGROUND OF THE INVENTION

A conventional radiation imaging apparatus separately incorporates an imaging radiation detector for two-dimensionally detecting radiation transmitted through a human body to generate an image and a radiation automatic exposure controller (AEC) for controlling exposure of radiation incident from a radiation source.

In a typical imaging radiation detector of this type, generally, pixels each comprising a MIS optical conversion element and a switching TFT are laid out in a matrix, and a phosphor layer which converts radiation into visible light is arranged on the radiation incident surface.

FIG. 12 is an equivalent circuit diagram of a conventional imaging radiation detector. FIG. 13 is a plan view of the imaging radiation detector shown in FIG. 12.

Referring to FIGS. 12 and 13, reference numeral 4008 denotes a semiconductor conversion element such as an optical conversion element; and 4007, a switching TFT. The semiconductor conversion element 4008 and switching TFT 4007 constitute a pixel.

The gate electrodes of the TFTs 4007 are connected to common gate lines (Vg) 4001. The gate lines 4001 are connected to a gate driver 4002 which ON/OFF-controls the TFTs. The source or drain electrodes of the TFTs 4007 are connected to common signal lines (Sig lines) 4003. The signal lines 4003 are connected to an amplifier IC 4004. As shown in FIG. 12, optical conversion element driving bias lines (Vs lines) 4005 are connected to a common electrode driver 4006.

Radiation that becomes incident on an object to be inspected passes through the object to be inspected while being attenuated by it. The radiation is converted into visible light by a phosphor layer. The visible light strikes the optical conversion element and is converted into charges. The charges are transferred to the signal line 4003 through the TFT 4007 in accordance with a gate driving pulse applied from the gate driver 4002 and read out to the outside by the amplifier IC 4004. After that, charges that are generated by the optical conversion element and remain there without being transferred are removed through the optical conversion element driving bias line (Vs line) 4005. This operation is called "refresh".

FIG. 14 is a schematic sectional view showing the layer structure of one pixel area which is formed from a MIS optical conversion element and a switching TFT (at a position corresponding to a line D–D' in FIG. 13). In this example, the MIS optical conversion element and switching TFT are simultaneously formed.

The MIS fourth embodiment is constituted by a first conductive layer (lower electrode) 4101, first insulating layer 4102, first semiconductor layer 4103, ohmic contact layer 4105, second conductive layer (bias line) 4106, and transparent electrode 4113 (e.g., ITO). The lower electrode is connected to the source or drain electrode of the TFT 4007. The TFT 4007 comprises the first conductive layer 4101 (gate electrode layer), first insulating layer 4102 (gate insulating layer), first semiconductor layer 4103, ohmic contact layer 4105, and second conductive layer 4106 (source and drain electrodes). Each gate line is connected to the electrode layer where the gate electrode of the TFT 4007 is formed. Each signal line is connected to the layer where the source and drain electrodes are formed. Then, a protective layer (e.g., an SiN and organic film) 4118 and phosphor layer 4119 which converts radiation into visible light are formed on the resultant structure.

An imaging radiation detector constituted by combining a radiation direct conversion material conventionally represented by a-Se, a storage capacitor, and a switching TFT has also been put into practical use.

A radiation automatic exposure controller (AEC) which controls exposure for radiation that becomes incident from a radiation source in the radiation imaging apparatus will be described next.

Generally, in a radiation imaging apparatus having two-dimensionally arrayed sensors, an incident radiation dose must be adjusted (AEC-controlled) for each object or every imaging. Conventionally, an AEC control sensor is arranged independently of the imaging radiation detector. A plurality of thin AEC sensors which attenuate radiation by about 5% are separately arranged in front of the imaging radiation detector. Incidence of radiation is stopped on the basis of the outputs from the AEC sensors, thereby obtaining an appropriate radiation dose for imaging. As an AEC sensor, a sensor which directly extracts radiation as charges by using an ion chamber, or a sensor which converts radiation into visible light through a phosphor, extracts the visible light through an optical fiber, and causes a photomultiplier to convert the visible light into charges is used. FIG. 15 is a view showing the imaging radiation detector and radiation automatic exposure controller (AEC), which constitute the conventional radiation imaging apparatus.

However, as described above, when AEC sensors are prepared independently of the two-dimensionally arrayed imaging radiation detectors to adjust (AEC-control) the incident radiation dose, the layout of the sensors poses a problem. Generally, information necessary for AEC is present at the center of an object. If AEC sensors should be laid out without impeding image sensing by the imaging radiation detectors, AEC sensors that attenuate radiation by only a minimum amount are necessary, resulting in an increase in cost of the entire apparatus.

In addition, there are no sensors that do not attenuate radiation at all. Hence, the image quality inevitably degrades at the central portion of an object, where an image that is very important for diagnosis is obtained. Furthermore, such separately prepared AEC sensors are disadvantageous for size reduction of a radiation imaging apparatus that is portable and can photograph various portions.

Contrary to this arrangement, U.S. Pat. No. 5,448,613 discloses an arrangement in which a second pixel group is arranged in a sensor substrate and driven by a shift register different from that for an image read sensor to detect the integration of signal charges.

However, when this arrangement is simply employed, some of image read pixels are replaced with second pixels. Accordingly, the opening ratio of pixels related to image reading with respect to all the pixels decreases. In addition, lead. interconnections must be prepared separately for the first pixels and second pixels. This may complicate the interconnection structure.

There is still room for improvement in the arrangement of the above prior art in association with the pixel layout and interconnection structure.

SUMMARY OF THE INVENTION

Accordingly, the present invention is conceived as a response to the above-described disadvantages of the conventional art.

According to one aspect of the present invention, preferably, an image sensing apparatus comprises conversion means for converting incident radiation into an electrical signal, and detection means, arranged below the conversion means, for detecting an incident amount of the radiation, wherein exposure control for the incident radiation is performed on the basis of a detection result by the detection means.

According to the second aspect of the present invention, there is provided a method of manufacturing a radiation imaging apparatus having a plurality of conversion means for converting incident radiation into an electrical signal and a plurality of detection means for detecting an incident amount of the radiation, characterized by comprising forming the detection means below the conversion means.

According to the third aspect of the present invention, there is provided an imaging circuit board characterized by comprising a switching element which switches an output operation of an electrical signal from conversion means for converting incident radiation into the electrical signal, and a detection element which detects an incident amount of the radiation, wherein the switching element and the detection element are formed in the same layer.

Other features and advantages of the present invention will be apparent from the following description taken in conjunction with the accompanying drawings, in which like reference characters designate the same or similar parts throughout the figures there.

BRIEF DESCRIPTION OF THE DRAWINGS

FIG. 28 is a pseudo equivalent circuit diagram of a TFT matrix panel arranged in a radiation image sensing apparatus according to the fifth embodiment of the present invention;

DETAILED DESCRIPTION OF THE PREFERRED EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

Figure 16:
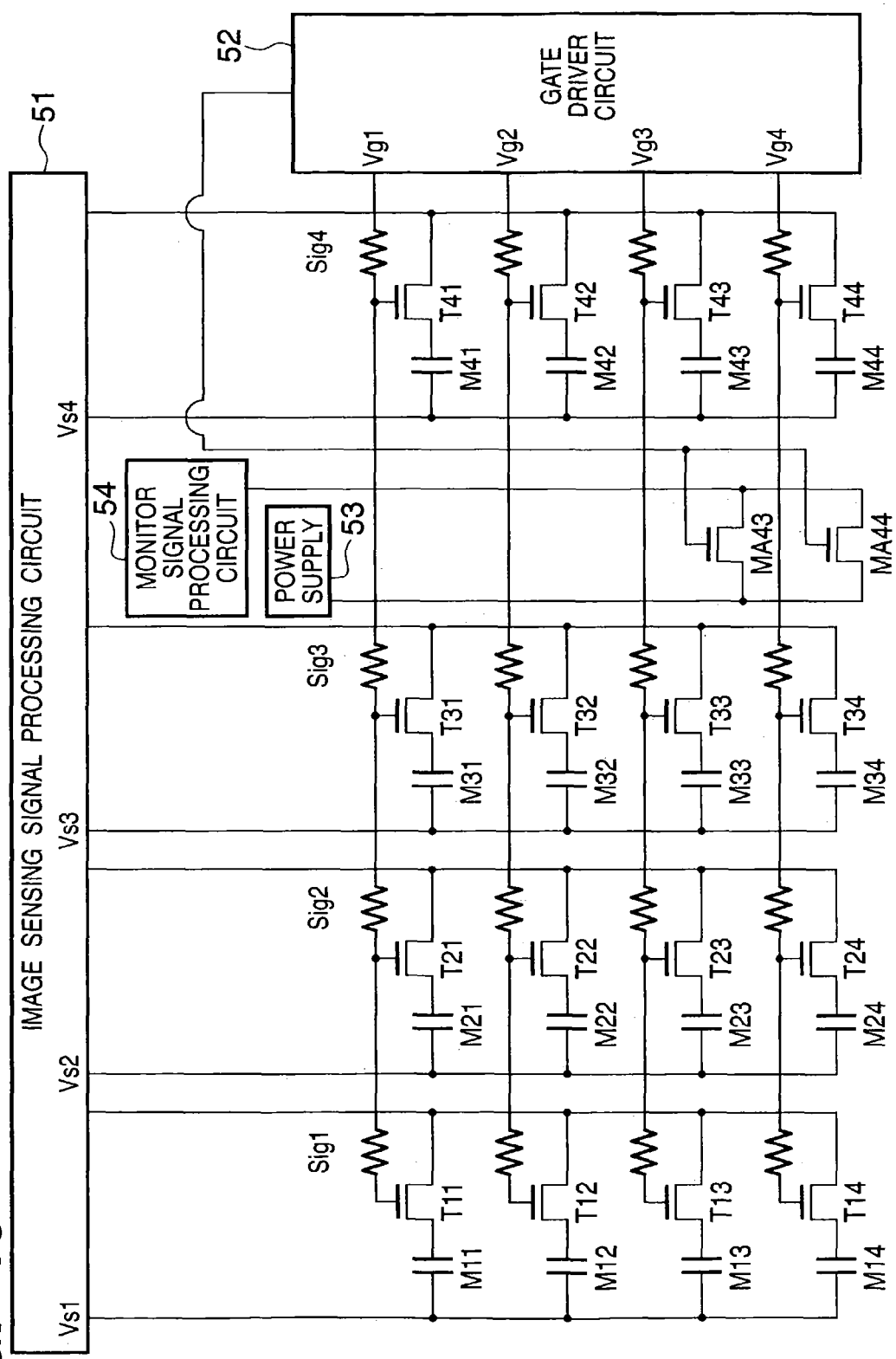
FIG. 16 is an equivalent circuit diagram showing the circuit arrangement of a radiation image sensing apparatus according to a reference example.
Figure 17:
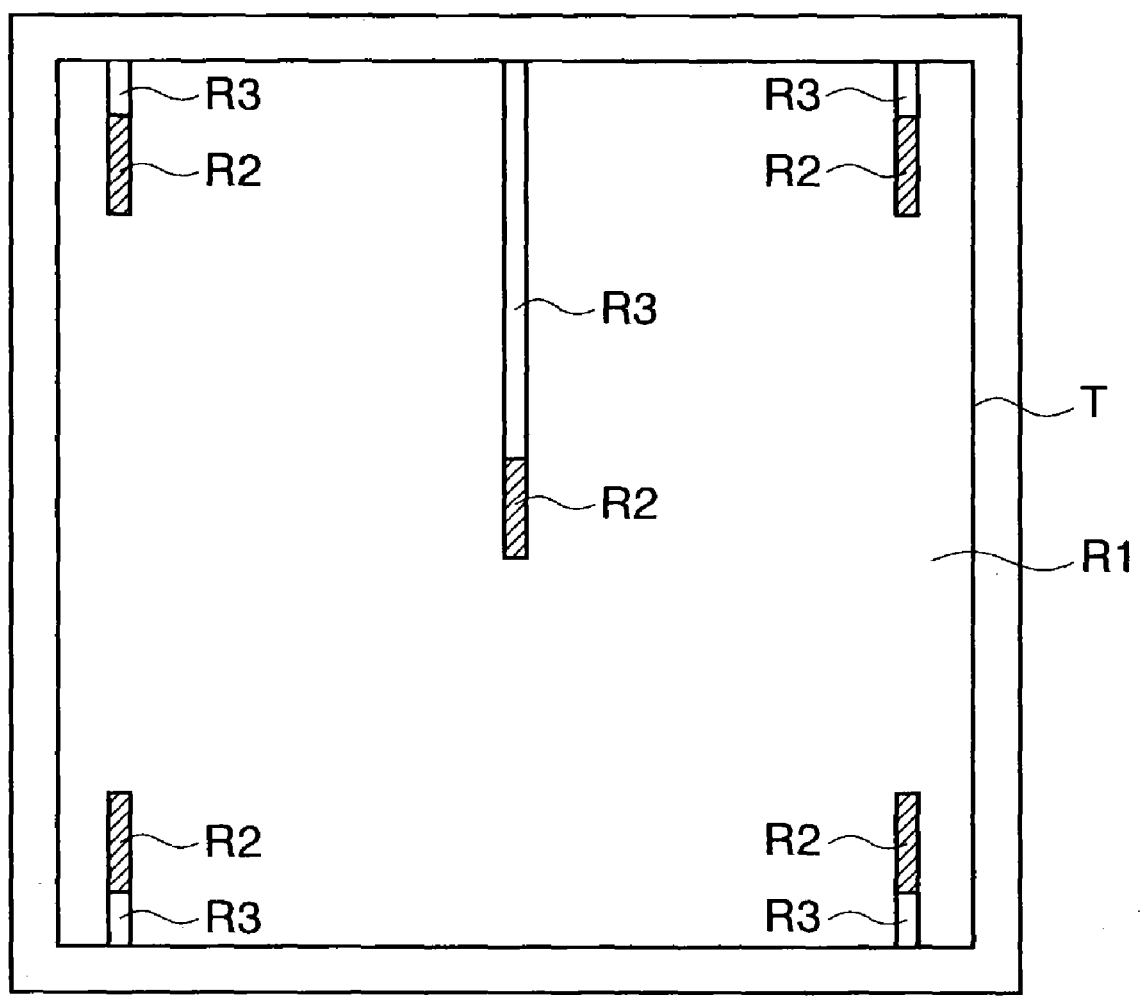
FIG. 17 is a layout diagram showing the overall arrangement of the radiation image sensing apparatus according to the reference example.

The embodiments of the present invention will be described below in detail with reference to the accompanying drawings. A reference example will be described for the sake of understanding of the present invention. This reference example is based on the description of U.S. Pat. No. 5,448,613 described above. FIG. 16 is an equivalent circuit diagram showing the circuit arrangement of a radiation image sensing apparatus according to the reference example. FIG. 17 is a layout diagram showing the overall arrangement of the radiation image sensing apparatus according to the reference example. FIG. 16 shows an example in which 4 (rows)×4 (columns) (=a total of 16) pixels are arranged in a pixel area. However, the number of pixels is not limited to this.

In this reference example, a combination of an image sensing photoelectric conversion element (first photoelectric conversion element) and a switching thin film transistor (TFT) or a combination of an image sensing photoelectric conversion element, switching TFT, and monitor photoelectric conversion element (second photoelectric conversion element) for AEC control is used for each pixel. More specifically, each of the pixels on the ath rows and the bth columns from the upper side in FIG. 16 has one image sensing photoelectric conversion element Mba and one switching thin film transistor Tba (a, b=1, 2, 3, 4). The pixels on the fourth column and the third and fourth rows respectively have monitor photoelectric conversion elements MA43 and MA44. The pixels on the fourth column and the first and second rows respectively have lead interconnections for the monitor photoelectric conversion elements.

The four image sensing photoelectric conversion elements arranged on the bth column are connected to a common bias line Vsb so that a predetermined bias is applied from an image sensing signal processing circuit 51 to the photoelectric conversion elements. The gate electrodes (control electrodes) of the four switching TFTs arranged on the ath row are connected to a common gate line Vga so that the gates are ON/OFF-controlled by a gate driver circuit 52. The source electrodes or drain electrodes of the four switching TFTs arranged on the bth column are connected to a common signal line Sigb. Signal lines Sig1 to Sig4 are connected to the image sensing signal processing circuit 51.

The monitor photoelectric conversion elements MA43 and MA44 are TFT sensors. Their source electrodes are connected to a power supply 53, their drain electrodes are connected to a monitor signal processing circuit 54, and their gate electrodes (control electrodes) are connected to the gate driver circuit 52. When a voltage is applied from the power supply 53 to each source electrode to apply a potential between the source and drain, electrons and holes generated when the light-receiving portion between the electrodes is irradiated with light are transported to each electrode by the potential difference between the source and the drain. When the charges are read in real time by the monitor signal processing circuit 54, the light irradiation amount can be measured.

When a circuit having the arrangement shown in FIG. 16 is applied to a radiation image sensing apparatus having a number of pixels, a conversion section (pixel area) T includes an area R1 where a plurality of pixels each having an image sensing photoelectric conversion element and switching TFT are collectively laid out, areas R2 where a plurality of pixels each having an image sensing photoelectric conversion element, switching TFT, and monitor photoelectric conversion element are collectively laid out, and areas R3 where a plurality of pixels each having an image sensing photoelectric conversion element, switching TFT, and lead interconnection for a monitor photoelectric conversion element are collectively laid out, as shown in FIG. 17.

Figure 18:
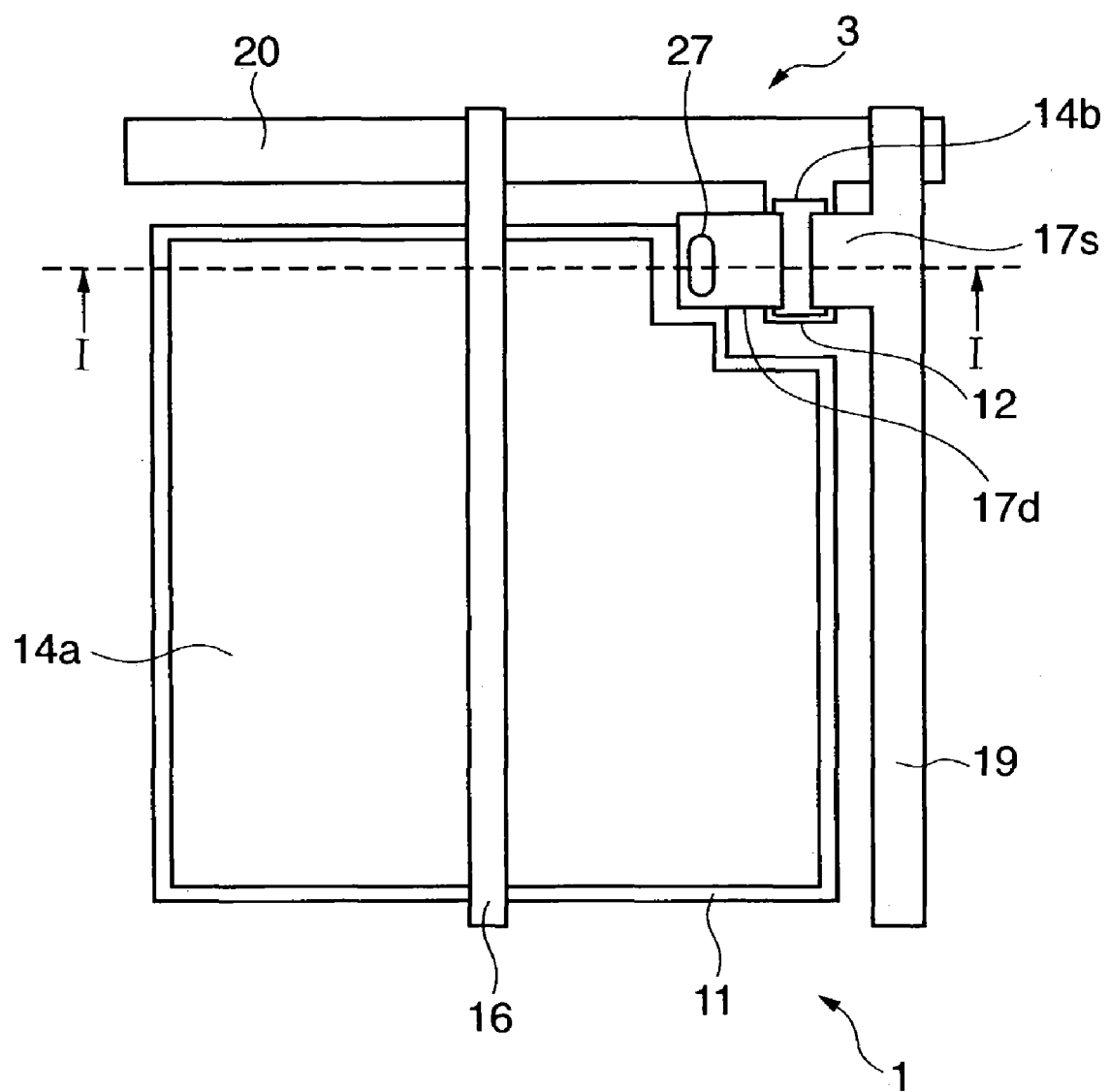
FIG. 18 is a layout diagram showing the planar structure of a pixel of the radiation image sensing apparatus according to the reference example, which has neither a monitor photoelectric conversion element nor lead interconnections therefor.
Figure 19:
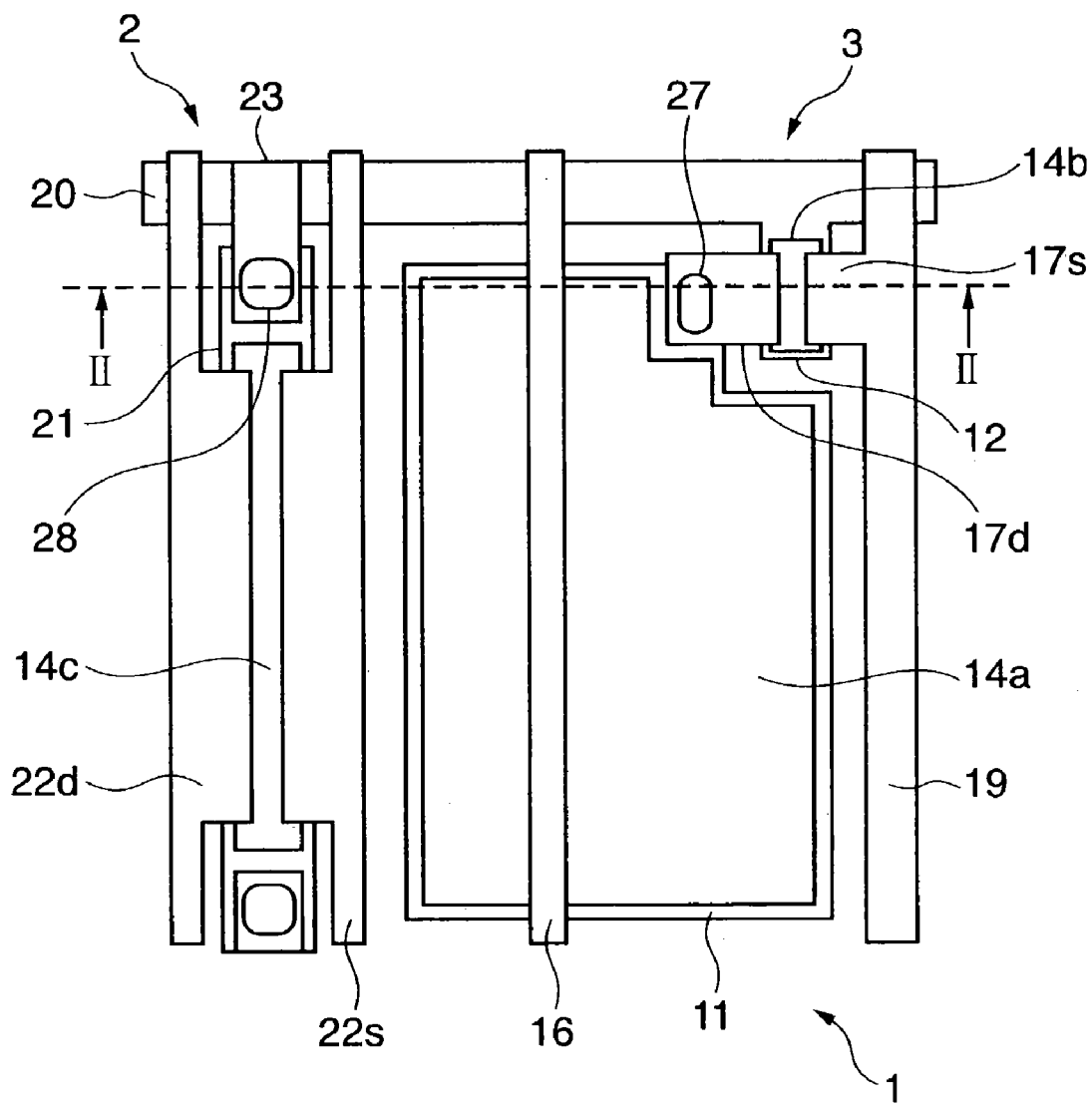
FIG. 19 is a layout diagram showing the planar structure of a pixel of the radiation image sensing apparatus according to the reference example, which has a monitor photoelectric conversion element.
Figure 20:
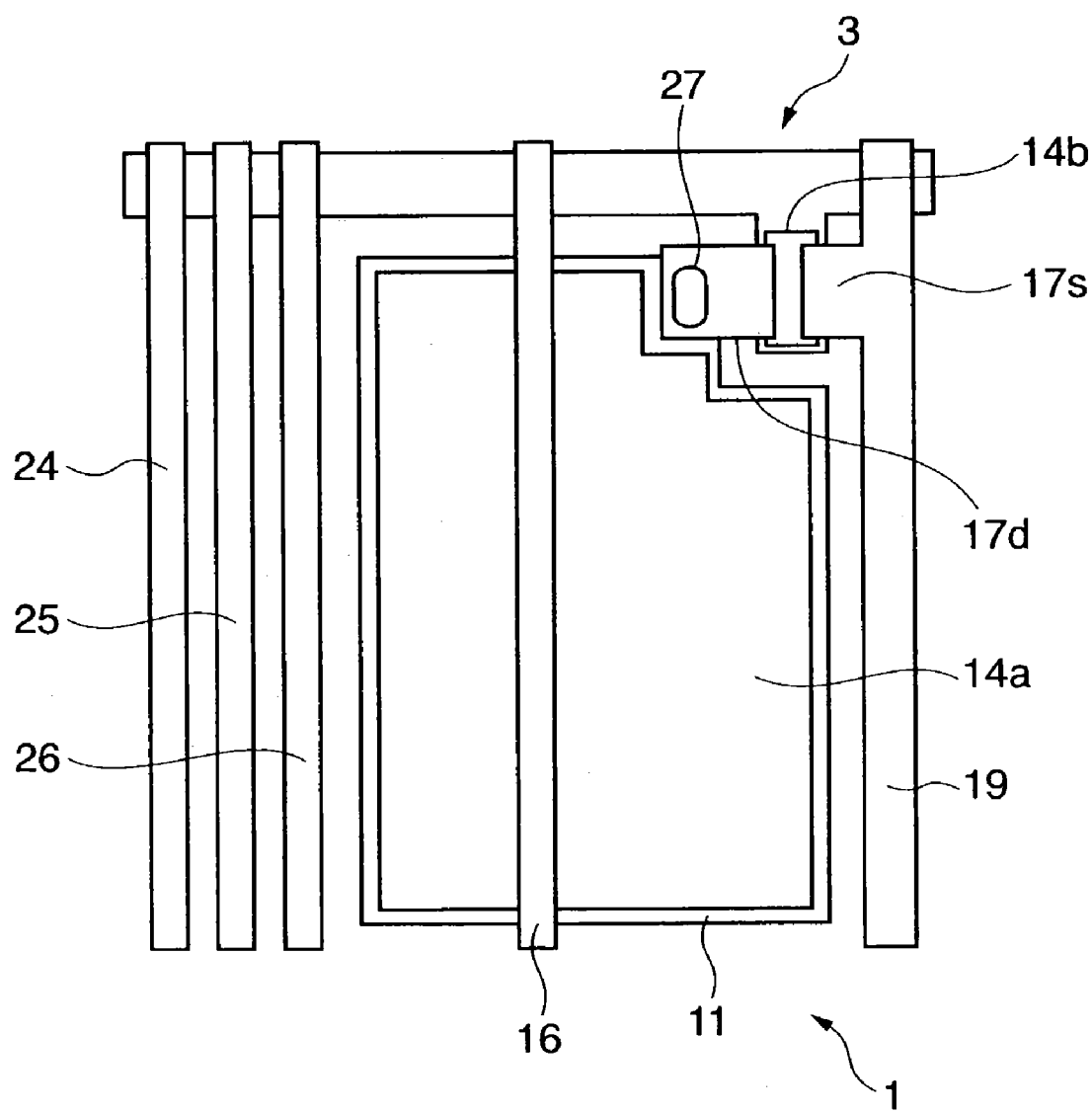
FIG. 20 is a layout diagram showing the planar structure of a pixel of the radiation image sensing apparatus according to the reference example, which has lead interconnections for a monitor photoelectric conversion element.
Figure 21:
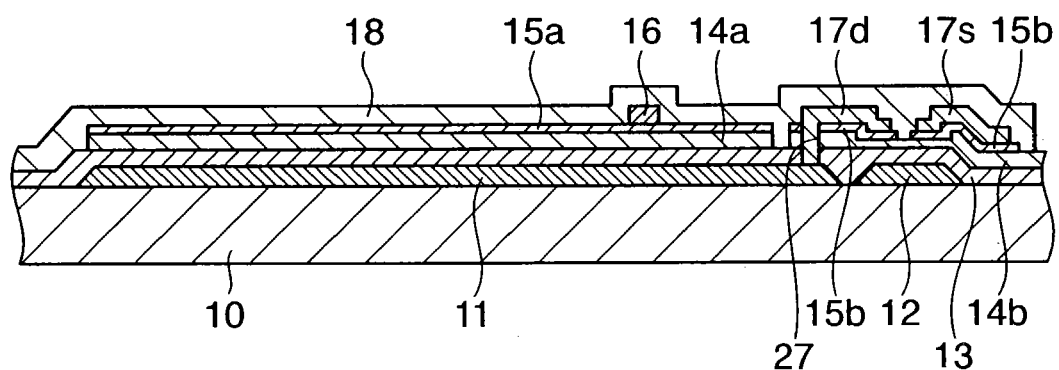
FIG. 21 is a sectional view taken along a line I—I in FIG. 18.
Figure 22:
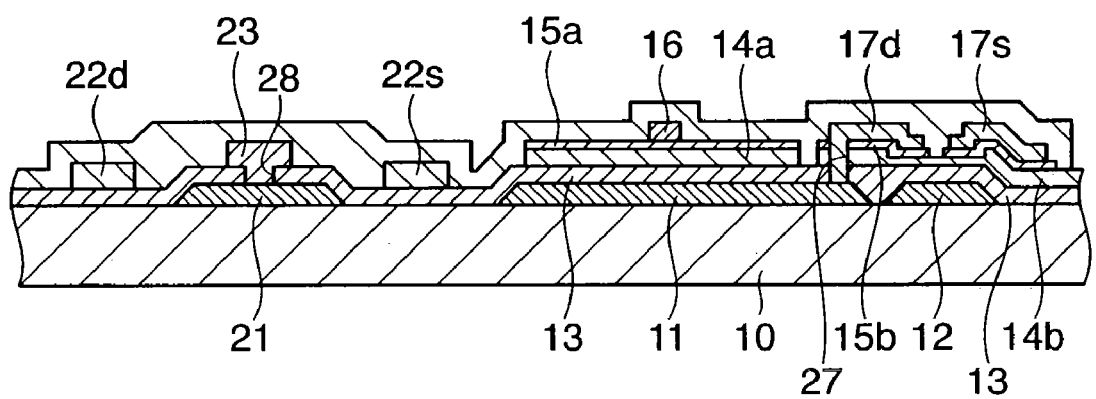
FIG. 22 is a sectional view taken along a line II—II in FIG. 19.

The planar structure of each of the three types of pixels in the reference example will be described next. FIG. 18 is a layout diagram showing the planar structure of a pixel of the radiation image sensing apparatus according to the reference example, which has neither a monitor photoelectric conversion element nor lead interconnections therefor. FIG. 19 is a layout diagram showing the planar structure of a pixel of the radiation image sensing apparatus according to the reference example, which has a monitor photoelectric conversion element. FIG. 20 is a layout diagram showing the planar structure of a pixel of the radiation image sensing apparatus according to the reference example, which has lead interconnections for a monitor photoelectric conversion element. FIG. 21 is a sectional view taken along a line I—I in FIG. 18. FIG. 22 is a sectional view taken along a line II—II in FIG. 19. Referring to FIGS. 18 to 20, a semiconductor layer is illustrated inside a control electrode that is present under the semiconductor layer for the illustrative convenience. In this reference example, the semiconductor layer or photoelectric conversion layer is formed to be wider than the control electrode that is present under the semiconductor layer or photoelectric conversion layer, and a first insulating film is present under the semiconductor layer or photoelectric conversion layer, as shown in FIGS. 21 and 22. This also applies to the remaining layout diagrams.

In the pixel which has neither a monitor photoelectric conversion element nor lead interconnections therefor, a sensor electrode 11 of an image sensing photoelectric conversion element 1, a control electrode (gate electrode) 12 of a switching TFT 3, and a first insulating film 13 that covers the sensor electrode 11 and control electrode 12 are formed on an insulating substrate 10, as shown in FIGS. 18 and 21.

On the first insulating film 13, a semiconductor layer (photoelectric conversion layer) 14a and ohmic contact layer 15a are sequentially stacked to be aligned with the sensor electrode 11. A common electrode bias line 16 is formed on the ohmic contact layer 15a. The common electrode bias line 16 corresponds to bias lines Vs1 to Vs4 in FIG. 16.

Also, a semiconductor layer 14b is formed on the first insulating film 13 to be aligned with the control electrode 12. Ohmic contact layers 15b are formed at two portions on the semiconductor layer 14b. One ohmic contact layer 15b extends to a portion on the sensor electrode 11. A drain electrode 17d is formed on the ohmic contact layer 15b that extends to a portion on the sensor electrode 11. A source electrode 17s is formed on the other ohmic contact layer 15b. A through hole 27 is formed through one ohmic contact layer 15b, the semiconductor layer 14b, and the first insulating film 13. The drain electrode 17d is electrically connected to the sensor electrode 11.

A second insulating film 18 is formed to cover the resultant structure. A phosphor layer (not shown) which converts X-rays into visible light is formed on the second insulating film 18.

The source electrode 17s is connected to a signal line 19. The control electrode 12 is connected to a gate line 20. The signal line 19 corresponds to the signal lines Sig1 to Sig4 in FIG. 16. The gate line 20 corresponds to gate lines Vg1 to Vg4 in FIG. 16. A pixel having this structure is present at least in the area R1. The pixel may be present in the areas R2 and R3.

The structure of a pixel having a monitor photoelectric conversion element will be described next. In this pixel, a control electrode 21 of a monitor photoelectric conversion element 2 is formed on the insulating substrate 10 in addition to the sensor electrode 11 of the image sensing photoelectric conversion element 1 and the control electrode (gate electrode) 12 of the switching TFT 3, as shown in FIGS. 19 and 22. The electrodes are covered with the first insulating film 13. This pixel will be compared with that shown in FIGS. 18 and 21. The shape and area of the pixel are the same. In the pixel shown in FIGS. 19 and 22, since the control electrode 21 is formed, the sensor electrode 11 and the like are smaller. The structures of the image sensing photoelectric conversion element 1 and switching TFT 3 are the same as those of the pixel shown in FIGS. 18 and 21 except that the image sensing photoelectric conversion element 1 is smaller.

In the monitor photoelectric conversion element 2, a semiconductor layer (photoelectric conversion layer) 14c is formed on the first insulating film 13 to be aligned with the control electrode 21. Ohmic contact layers 15c are formed at two portions on the semiconductor layer 14c. A drain electrode 22d and a source electrode 22s are formed on the two ohmic contact layers 15c, respectively. The drain electrode 22d and source electrode 22s are covered with the second insulating film 18.

As shown in FIG. 19, the control electrode 21 is formed to be longer than the semiconductor layer 14c. A through hole 28 is formed at a position of the first insulating film 13, which is aligned to the two terminal portions of the control electrode 21. An upper interconnection 23 which electrically connects the control electrodes 21 of pixels that are adjacent to each other via the gate line 20 is formed over the gate line 20 through the through hole 28. A pixel having the above structure is present in the area R2.

A pixel having lead interconnections for a monitor photoelectric conversion element has an interconnection 24 for the drain electrode 22d, an interconnection 25 for the control electrode 21, and an interconnection 26 for the source electrode 22s, as shown in FIG. 20. This pixel will be compared with that shown in FIGS. 18 and 21. The shape and area of the pixel are the same. In the pixel shown in FIG. 20, since the interconnections 24 to 26 are formed, the sensor electrode 11 and the like are smaller. The structures of the image sensing photoelectric conversion element 1 and switching TFT 3 are the same as those of the pixel shown in FIGS. 18 and 21 except that the image sensing photoelectric conversion element 1 is smaller. A pixel having this structure is present in the area R3.

Although not illustrated in FIGS. 21 and 22, a phosphor layer which converts X-rays into visible light is formed on the second insulating film 18.

According to the reference example having the above arrangement, since the monitor photoelectric conversion element 2 is formed on the insulating substrate 10 independently of the image sensing photoelectric conversion element 1, any separate radiation monitor board need not be prepared, and the entire apparatus can be made compact and lightweight.

However, as shown in FIG. 19, the through hole 28 must be formed to connect the control electrode 21 and upper interconnection 23. Hence, the light-receiving area of the image sensing photoelectric conversion element 1 is not sufficiently large. In addition, as shown in FIG. 20, in the pixel having the lead interconnections 24 to 26 the light-receiving area of the image sensing phoelectric conversion element 1 is much smaller than that of the pixel shown in FIG. 18. For the arrangement of this reference example, the opening ratios of the two phoelectric conversion elements 1 and 2 must be further increased.

The embodiments of the present invention will be described below.

(First Embodiment)

As the first embodiment of the present invention, in an imaging radiation detector that constitutes a radiation imaging apparatus, AEC sensors (second optical conversion elements) are formed simultaneously with switching TFTS. MIS optical conversion elements (first optical conversion elements) are stacked on the AEC sensors via an organic insulating film. An example will be described with reference to the accompanying drawings, in which optical absorption layers between the MIS optical conversion elements (first optical conversion elements) for imaging are thinned to make light incident on the gaps between the elements. A conversion element which converts light into charges will be referred to as an optical conversion element. A conversion element which directly converts radiation into charges will be referred to as a radiation conversion element.

Figure 1:
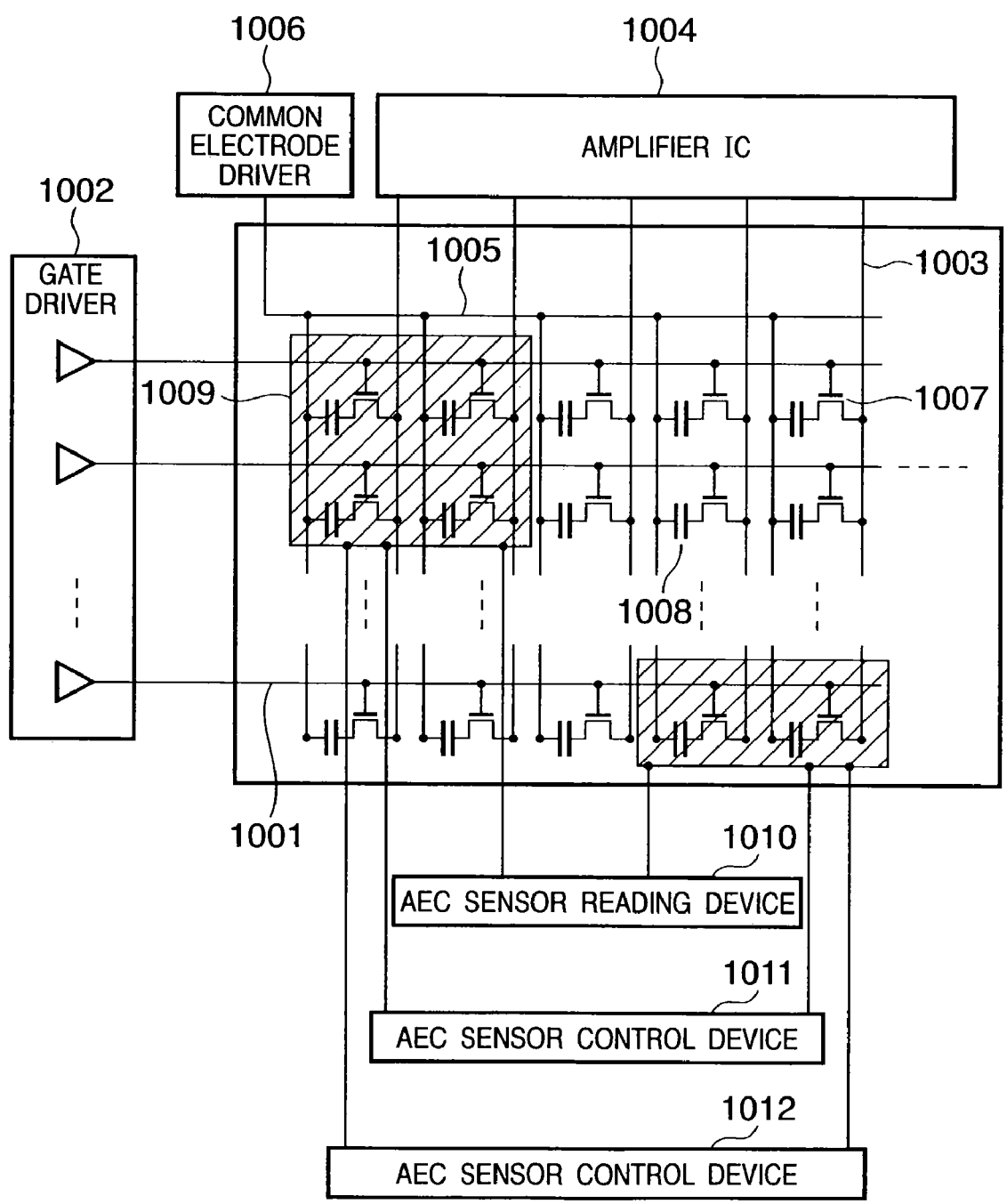
FIG. 1 is a schematic equivalent circuit diagram showing a radiation imaging apparatus according to the first embodiment of the present invention.
Figure 2:
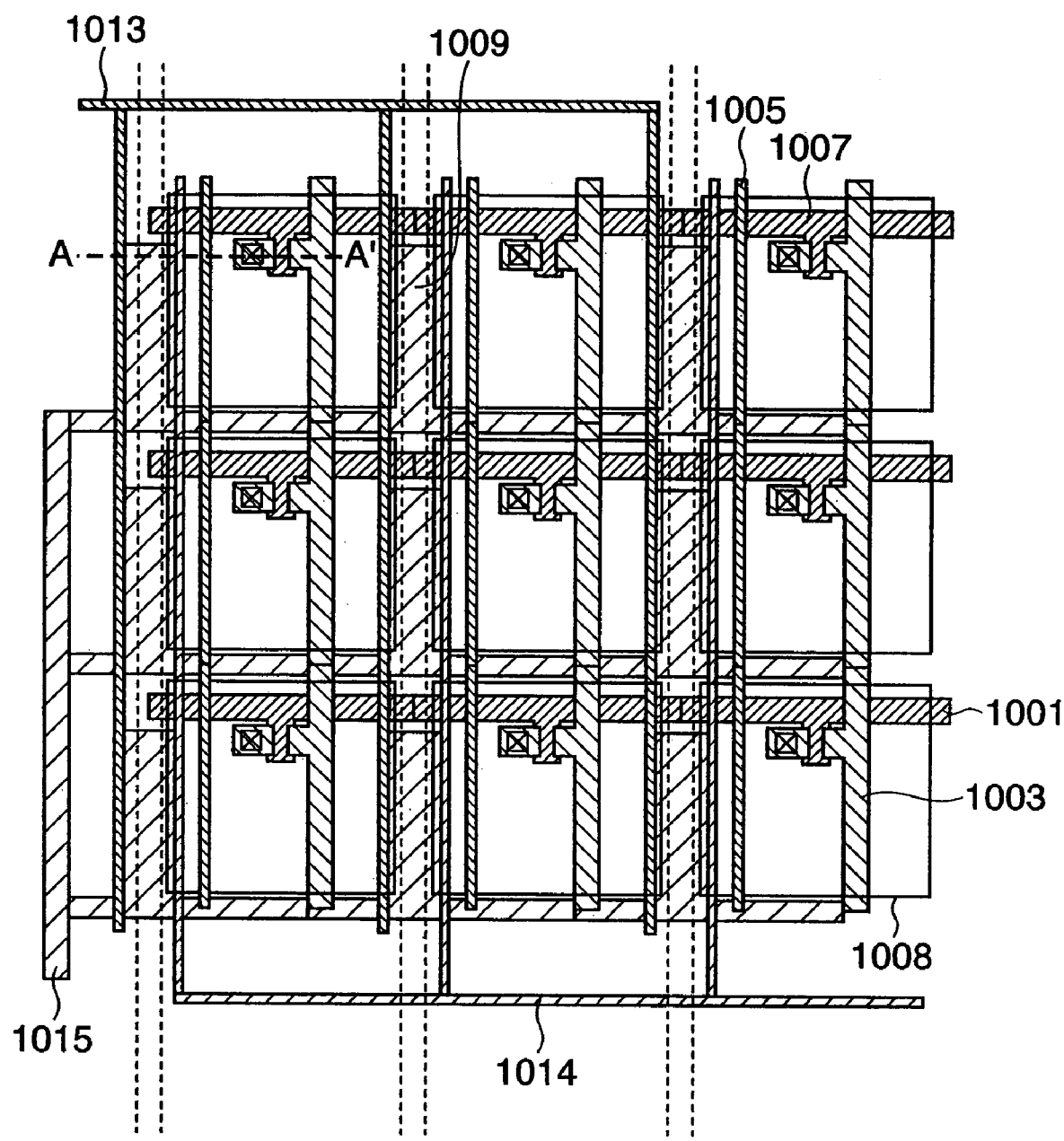
FIG. 2 is a schematic plan view showing the radiation imaging apparatus according to the first embodiment of the present invention.
Figure 3:
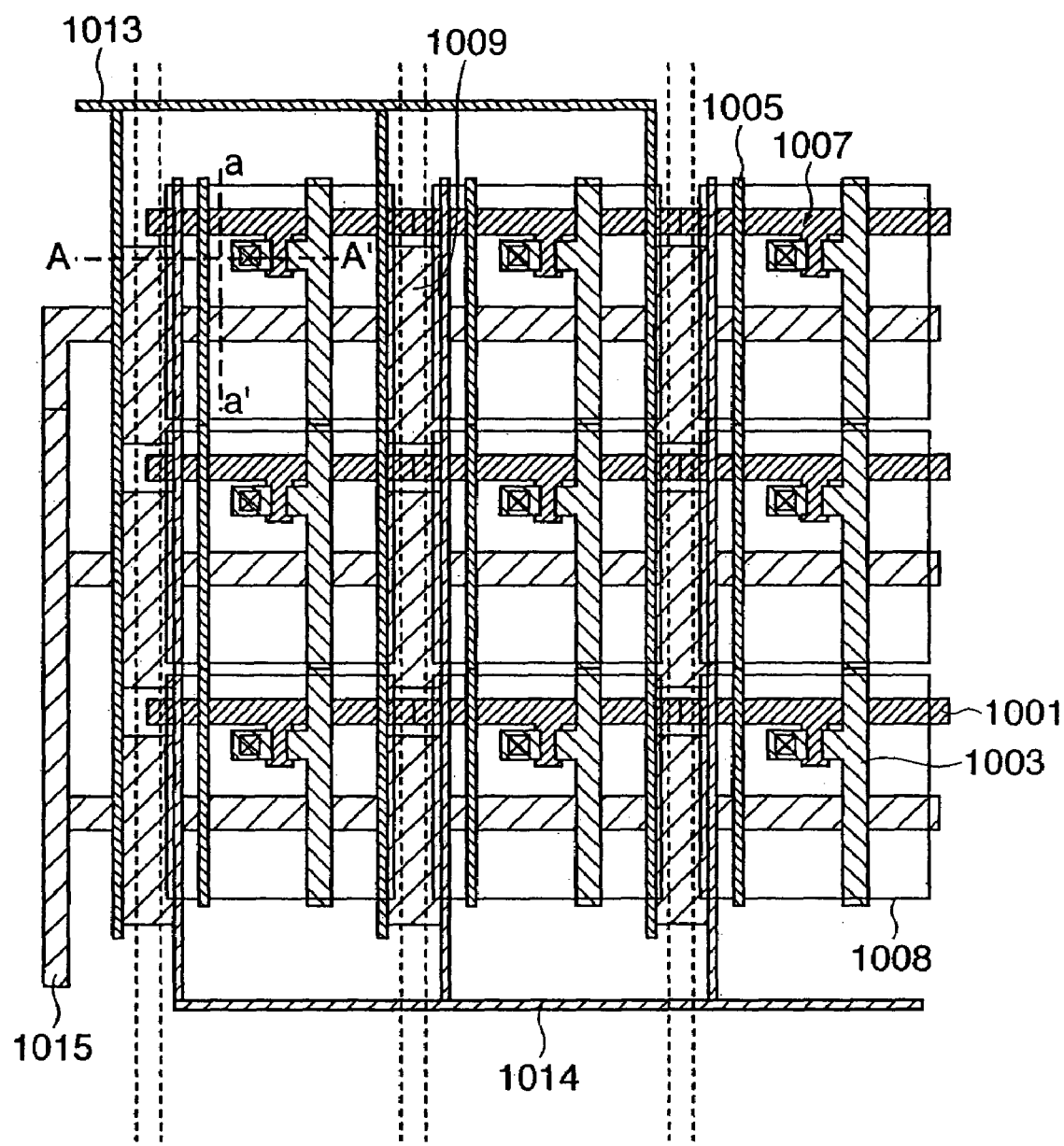
FIG. 3 is a schematic plan view showing the radiation imaging apparatus according to the first embodiment of the present invention.
Figure 4A:
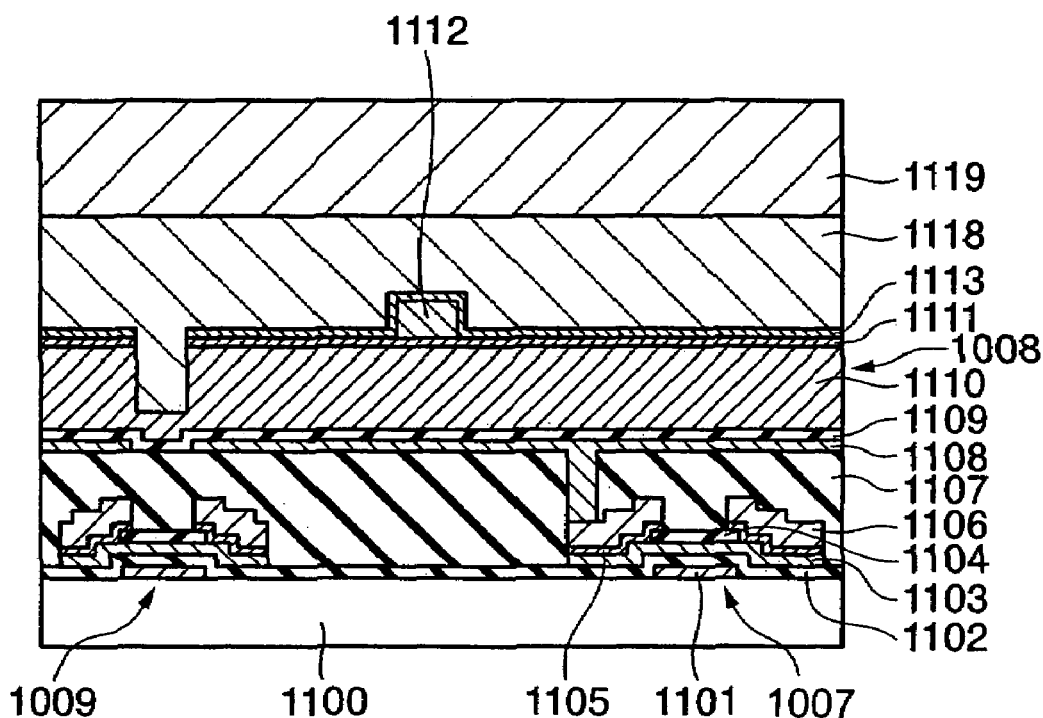
FIGS. 4A and 4B are schematic sectional views showing one pixel area of the radiation imaging apparatus according to the first embodiment of the present invention.

FIG. 1 is a schematic equivalent circuit diagram of a radiation imaging apparatus according to this embodiment. FIGS. 2 and 3 are schematic plan views of the radiation imaging apparatus according to this embodiment. FIG. 4A is a schematic sectional view of one pixel area (at a position corresponding to a line A–A' in FIGS. 2 and 3) of the radiation imaging apparatus according to this embodiment.

Figure 4B:
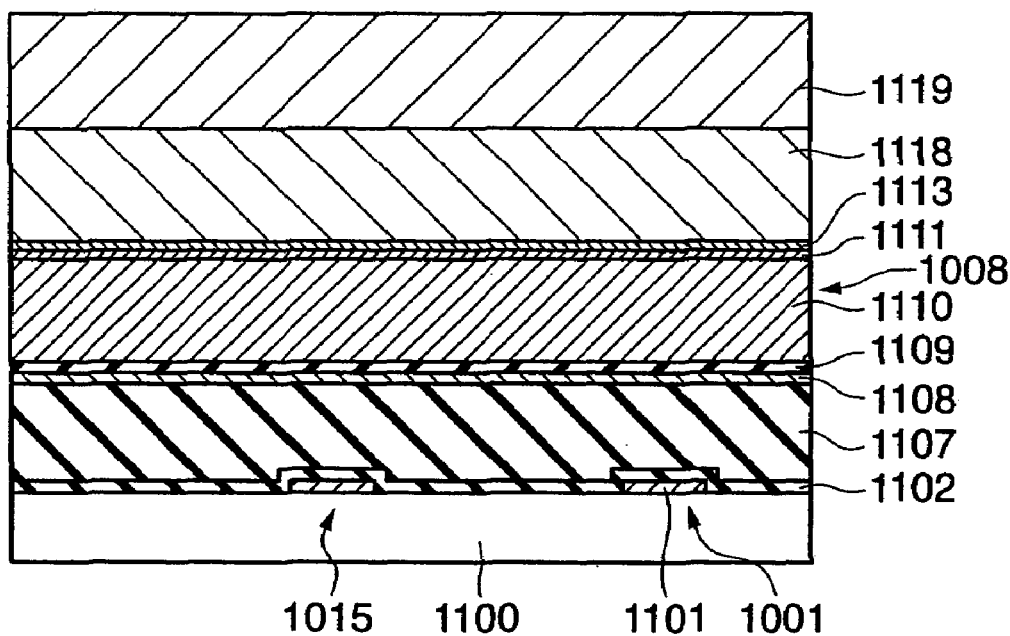

FIG. 4B is a schematic sectional view of one pixel area (at a position corresponding to a line a–a' in FIG. 3) of the radiation imaging apparatus according to this embodiment.

Referring to FIGS. 1, 2, 3, 4A, and 4B, reference numeral 1008 denotes a semiconductor conversion element such as a first optical conversion element; and 1007, a switching TFT. The semiconductor conversion element 1008 and switching TFT 1007 constitute a pixel. A second optical conversion element 1009 is formed in correspondence with a plurality of pixels. The second optical conversion element 1009 is connected to an AEC sensor reading device 1010 and AEC sensor control devices 1011 and 1012.

The pixel area shown in the plan views of FIGS. 2 and 3 comprises 3×3 pixels. Actually, for example, 2,000×2,000 pixels are laid out on an insulating substrate. The second optical conversion element is formed in correspondence with 2×2 pixels. Actually, for example, one second optical conversion element is formed in correspondence with 200×200 pixels. At least three second optical conversion elements are arranged in the panel.

The first optical conversion element 1008 and switching TFT 1007 are the same as in the prior art. The gate electrodes of the TFTs 1007 are connected to common gate lines 1001 (Vg). The gate lines 1001 are connected to a gate driver 1002 which ON/OFF-controls the TFTs. The source or drain electrodes of the TFTs 1007 are connected to common signal lines (Sig lines) 1003. The signal lines 1003 are connected to an amplifier IC 1004. As shown in FIG. 1, optical conversion element driving bias lines (Vs lines) 1005 are connected to a common electrode driver 1006.

A source line 1014 and gate line 1015 of each second optical conversion element 1009 are connected to the AEC sensor control devices 1011 and 1012, respectively. In reading charges, the charges can always be output in accordance with an incident light amount. For this purpose, a predetermined potential is always applied. The charges detected by the second optical conversion element 1009 are amplified by the AEC sensor reading device 1010 through a drain line 1013. The outputs are totalized to detect the total incident amount of the radiation.

The layer structure of the radiation imaging apparatus according to this embodiment will be described next with reference to FIG. 4A.

First, the TFT 1007 and the second optical conversion element 1009 to be used as an AEC sensor are formed on a glass substrate 1100. A first conductive layer 1101 is formed by sputtering. The gate electrode and gate line (e.g., AlNd/Mo: 2,500 Å) of the TFT 1007 and second optical conversion element 1009, a first insulating layer 1102 (e.g., SiN: 3,000 Å), a first semiconductor layer (first optical absorption layer) 1103 (e.g., a-Si: 1,500 Å), and a second insulating layer 1104 (e.g., SiN: 2,000 Å) are continuously formed by CVD. The second insulating layer is formed on the gate electrodes and gate lines by back exposure as the protective film between the sources and the drains.

Subsequently, a first ohmic contact layer 1105 (e.g., a-Si (n+): 200 Å) is formed by CVD, and a second conductive layer 1106 (e.g., Mo/Al/Mo: 4,000 Å) is formed by sputtering, thereby forming the source and drain electrodes and interconnections. A third insulating layer 1107 (e.g., organic film BCB (benzocyclobutene)) serving as a protective layer is formed on the resultant structure. As described above, according to this embodiment, the TFT 1007 and second optical conversion element 1009 are simultaneously formed so that an image sensing circuit board having the TFT 1007 and second optical conversion element 1009 in the same layer is formed.

A third conductive layer 1108 (e.g., Mo/Al/Mo: 4,000 Å) is formed by sputtering and connected to the source or drain electrode of the. TFT 1007 through a contact hole. The third conductive layer 1108 is also separated into the lower electrodes of the first optical conversion elements 1008 in correspondence with the respective pixels. A fourth insulating layer 1109 (e.g., SiN: 2,000 Å), a second semiconductor layer (second optical absorption layer) 1110 (e.g., a-Si: 5,000 Å), and a second ohmic contact layer 1111 (e.g., a-Si (n+): 200 Å) are continuously formed on the resultant structure by CVD.

In addition, a fourth conductive layer 1112 (e.g., Mo/Al/Mo: 4,000 Å) is formed by sputtering to form the bias line of the first optical conversion element 1008. Subsequently, a transparent conductive layer 1113 (e.g., ITO: 200 Å) is formed by sputtering. To make light incident on the second optical conversion element 1009 (optical propagation area), the transparent conductive layer 1113, second ohmic contact layer 1111, and second semiconductor layer (second optical absorption layer) 1110 are etched into a stripe shape along the source and drain lines of the second optical conversion element 1009 by wet and dry etching, thereby forming a recess in the second semiconductor layer.

It is preferable to form an opening pattern by completely removing the second semiconductor layer (second optical absorption layer) 1110 because the light incident amount on the second optical conversion element 1009 increases. However, even a half-etched state as shown in FIG. 4A can also function as far as the absorption amount in the second semiconductor layer (second optical absorption layer) 1110 is 50% or less.

In this embodiment, optical propagation areas are formed into a stripe shape along the source and drain lines of the second optical conversion elements 1009 (FIG. 4A). The second semiconductor layer (second optical absorption layer) 1110 may be element-isolated in correspondence with the respective pixels. After that, a protective layer 1118 (e.g., SiN and organic film) and phosphor layer 1119 are formed on the upper surface.

In this embodiment, a MIS optical conversion element is used as the first optical conversion element 1008. A PIN optical conversion element may be used, as a matter of course. In this embodiment, a TFT optical conversion element constituted by three elements, i.e., a gate, source, and drain is used as the second optical conversion element 1009. However, sufficient performance can be obtained even with a structure having no gate. When the gate lines 1015 of the second optical conversion elements are arranged in the gaps between the lower electrodes of the first optical conversion elements, as shown in FIG. 2, generation of any parasitic capacitance between the gate lines 1015 and the first optical conversion elements can be avoided. This is advantageous in terms of noise and the like. When the gate lines are arranged immediately under the lower electrodes of the first optical conversion elements, as shown in FIGS. 3 and 4B, the lower electrode area of the first optical conversion elements can be increased. Hence, the signal improves. In this embodiment, as shown in FIGS. 2 and 3, the first optical conversion elements 1008 are also formed above the TFTs 1007. With this structure, a high opening ratio is ensured for the first optical conversion elements 1008. The portions above the TFTs 1007 may be removed from the formation areas of the first optical conversion elements 1008.

According to this embodiment, the AEC sensors (second optical conversion elements) are formed on the substrate of the imaging radiation detector simultaneously. For this reason, the separate radiation automatic exposure controller (AEC) need not be separately arranged. The radiation imaging apparatus can be made compact.

In this embodiment, it is effective from the viewpoint of cost because the substrate preparation process of the imaging radiation detector is directly used.

Conventionally, separate AEC sensors are arranged in front of the imaging radiation detector. In this embodiment, however, since the AEC sensors (second optical conversion elements) are formed without any influence on the opening ratio of the first optical conversion elements for imaging, the image quality does not degrade.

In this embodiment, the second optical conversion element in the narrow area between the first optical conversion elements is formed in correspondence with a plurality of pixels (e.g., 200×200 pixels) and electrically connected. For this reason, a sufficient output can be extracted as an AEC sensor.

The AEC sensor can also be used as a radiation monitor.

A radiation monitor detects ON/OFF of radiation that becomes incident on the imaging radiation detector and controls detection by it. The radiation monitor can be used not only in the first embodiment but in all the embodiments of the present invention.

(Second Embodiment)

The second embodiment of the present invention will be described next.

As the second embodiment of the present invention, an example will be described with reference to the accompanying drawings, in which in an imaging radiation detector that constitutes a radiation imaging apparatus, when AEC sensors (second optical conversion elements) are formed simultaneously with switching TFTs, and PIN optical conversion elements (first optical conversion elements) are stacked on the AEC sensors via an organic insulating film, optical absorption layers between the PIN optical conversion elements (first optical conversion elements) for imaging are removed to make light incident on the gaps between the elements.

Figure 5:
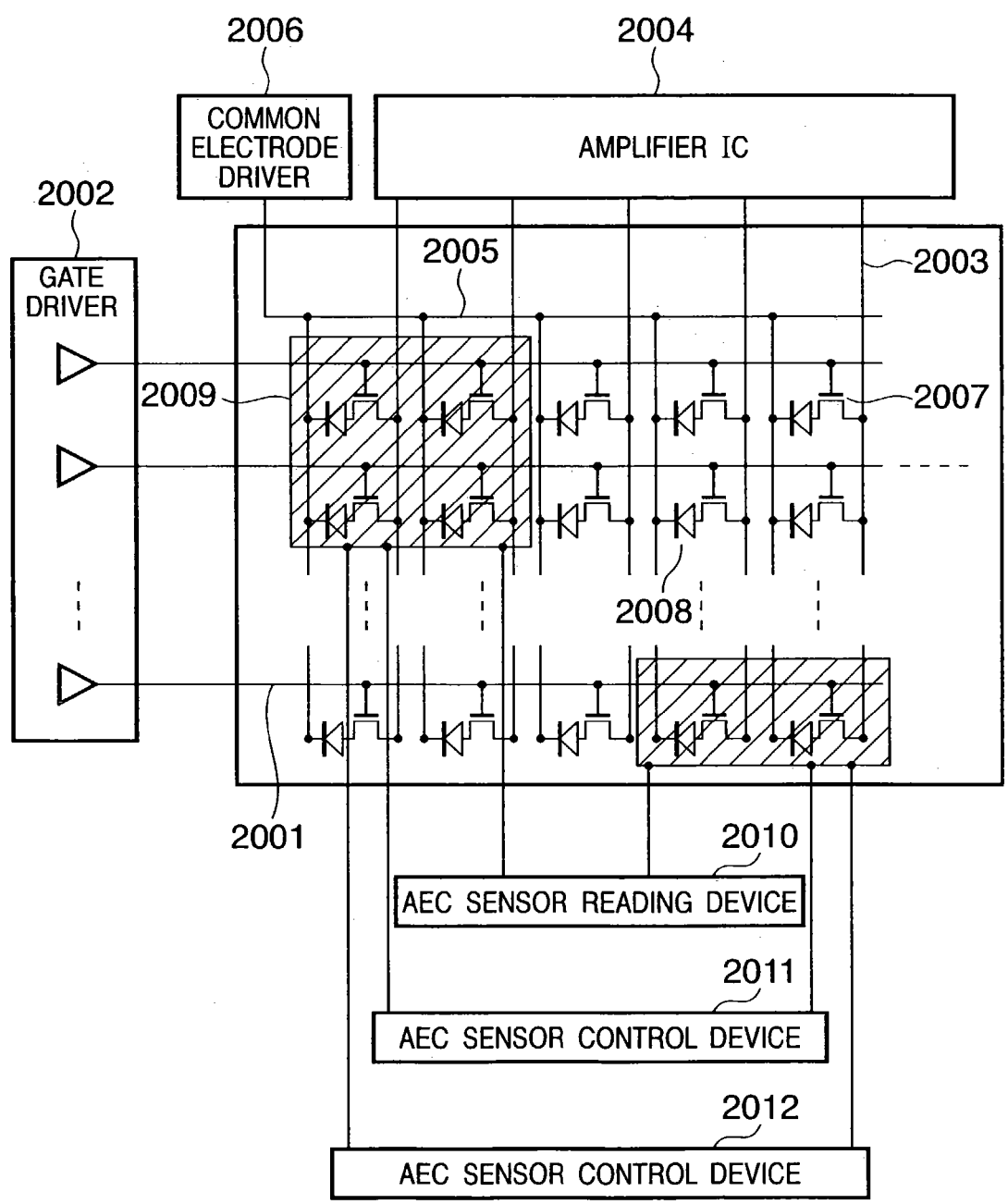
FIG. 5 is a schematic equivalent circuit diagram showing a radiation imaging apparatus according to the second embodiment of the present invention.
Figure 6:
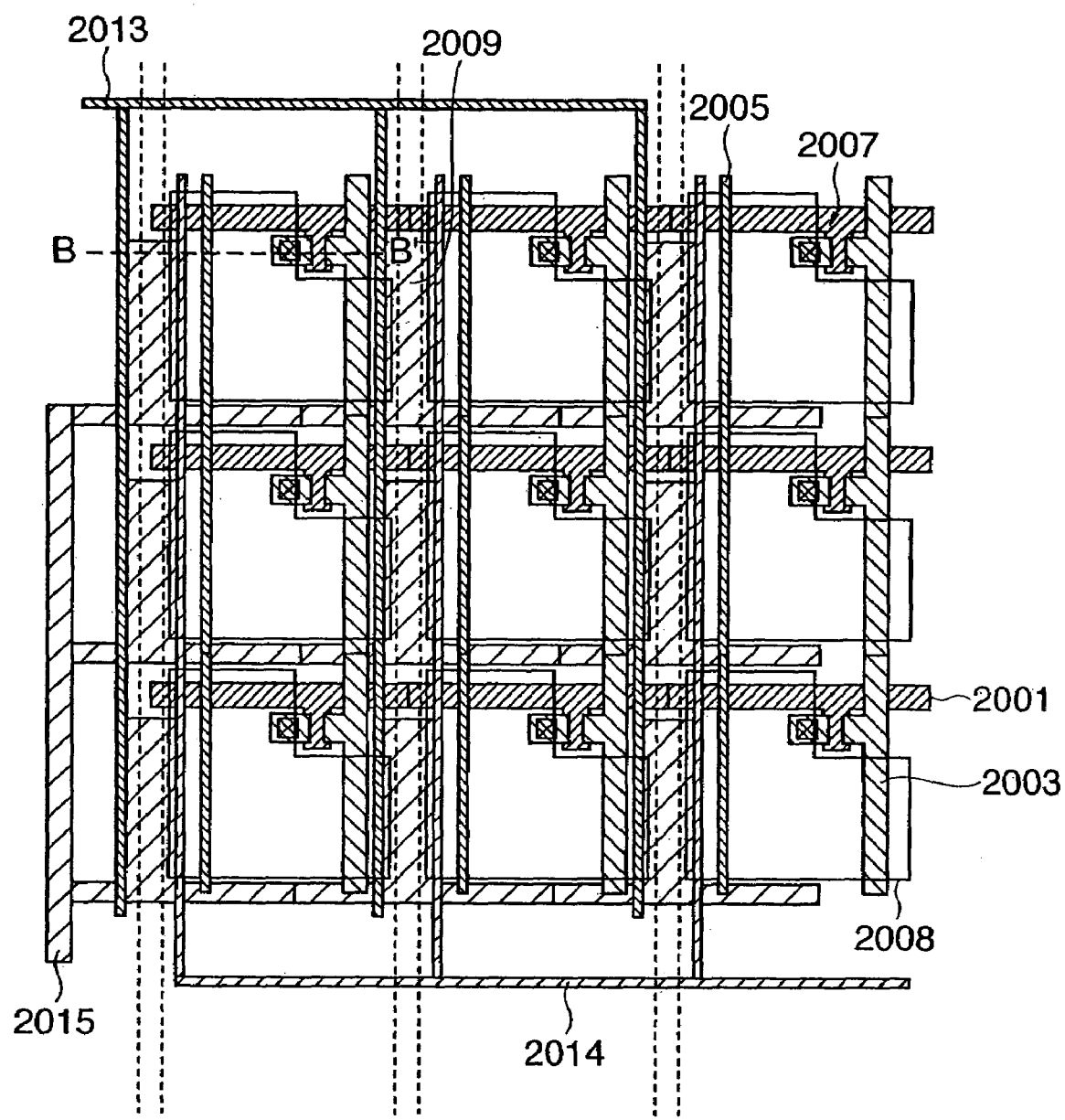
FIG. 6 is a schematic plan view showing the radiation imaging apparatus according to the second embodiment of the present invention.
Figure 7:
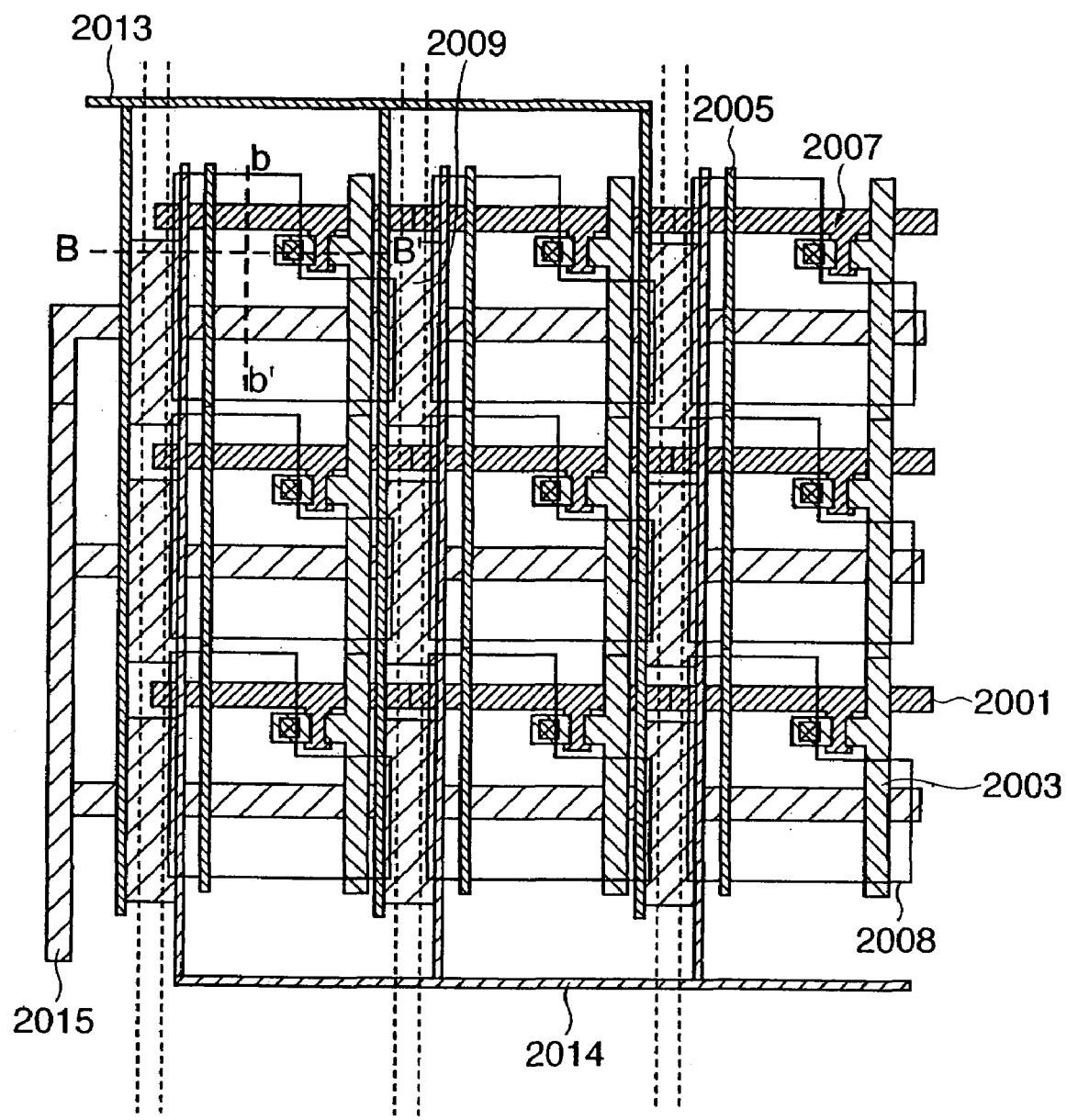
FIG. 7 is a schematic plan view showing the radiation imaging apparatus according to the second embodiment of the present invention.
Figure 8A:
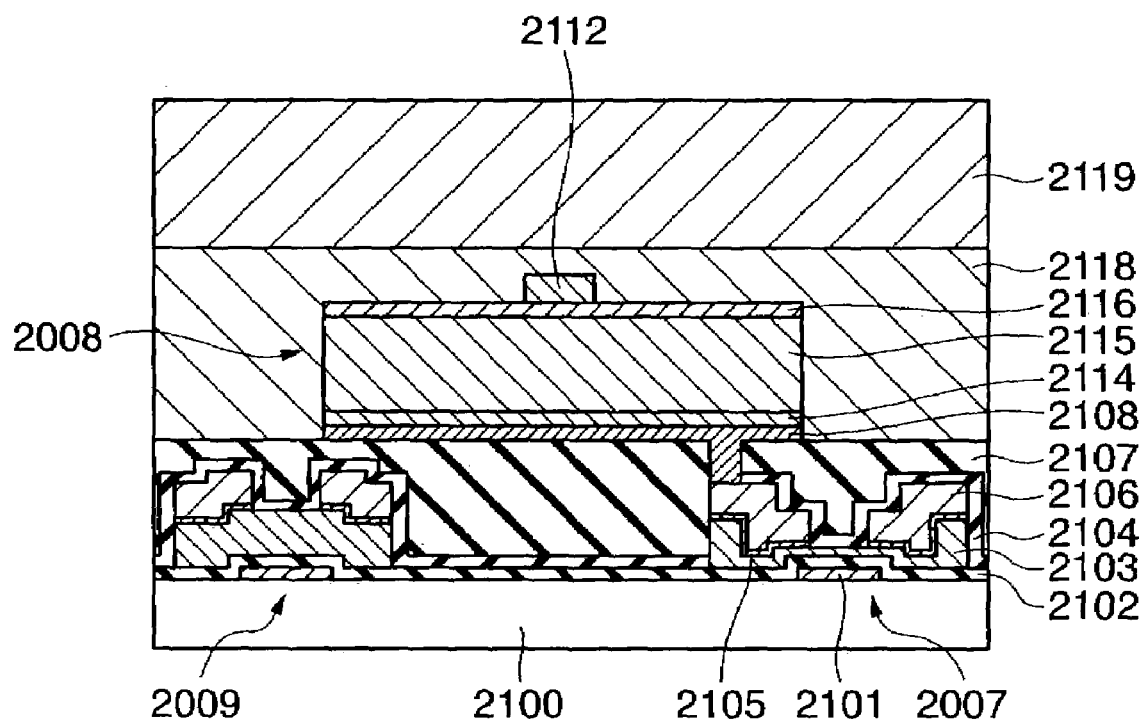
FIGS. 8A and 8B are schematic sectional views showing one pixel area of the radiation imaging apparatus according to the second embodiment of the present invention.
Figure 8B:
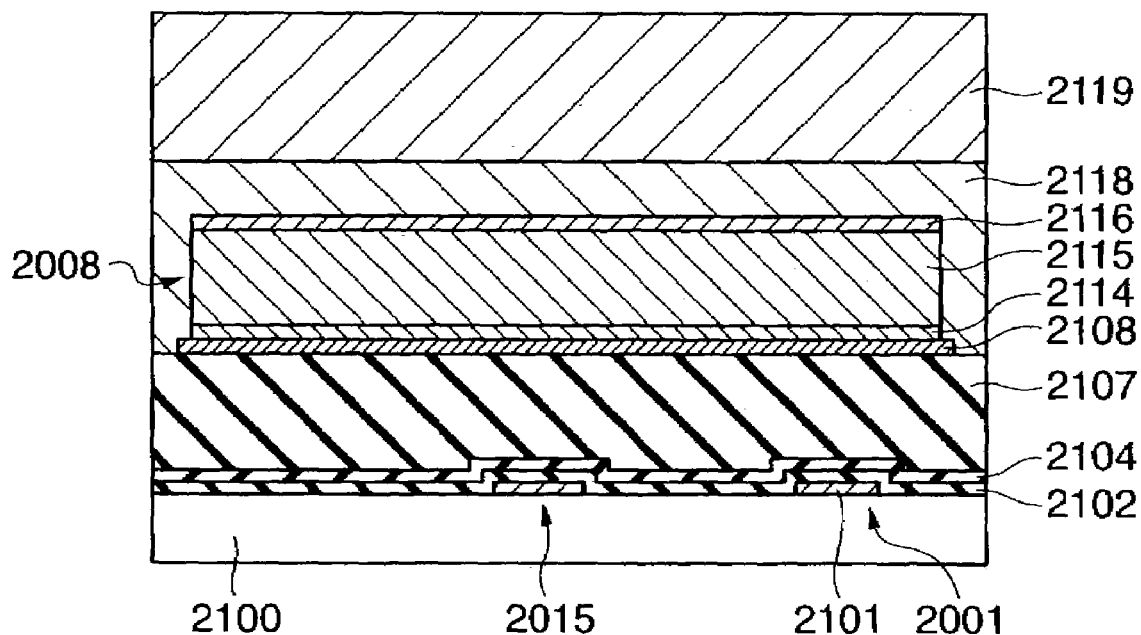

FIG. 5 is a schematic equivalent circuit diagram of a radiation imaging apparatus according to this embodiment. FIGS. 6 and 7 are schematic plan views of the radiation imaging apparatus according to this embodiment. FIG. 8A is a schematic sectional view of one pixel area (at a position, corresponding to a line B–B' in FIGS. 6 and 7) of the radiation imaging apparatus according to this embodiment. FIG. 8B is a schematic sectional view of one pixel area (at a position corresponding to a line b–b' in FIG. 7) of the radiation imaging apparatus according to this embodiment.

Referring to FIGS. 5, 6, and 7, reference numeral 2008 denotes a semiconductor conversion element such as a first optical conversion element; and 2007, a switching TFT. The semiconductor conversion element 2008 and switching TFT 2007 constitute a pixel. A second optical conversion element 2009 is formed in correspondence with a plurality of pixels. The second optical conversion element 2009 is connected to an AEC sensor reading device 2010 and AEC sensor control devices 2011 and 2012.

The pixel area shown in the plan views of FIGS. 6 and 7 comprises 3×3 pixels. Actually, for example, 2,000×2,000 pixels are laid out on an insulating substrate. The second optical conversion element is formed in correspondence with 2×2 pixels. Actually, for example, one second optical conversion element is formed in correspondence with 200×200 pixels. At least three second optical conversion elements are arranged in the panel.

The first optical conversion element 2008 and switching TFT 2007 are the same as in the prior art. The gate electrodes of the TFTs 2007 are connected to common gate lines 2001 (Vg). The gate lines are connected to a gate driver 2002 which ON/OFF-controls the TFTs 2007. The source or drain electrodes of the TFTs 2007 are connected to common signal lines (Sig lines) 2003. The signal lines 2003 are connected to an amplifier IC 2004. As shown in FIG. 5, optical conversion element driving bias lines (Vs lines) 2005 are connected to a common electrode driver 2006.

A source line 2014 and gate line 2015 of each second optical conversion element 2009 are connected to the AEC sensor control devices 2011 and 2012, respectively. In reading charges, the charges can always be output in accordance with an incident light amount. For this purpose, a predetermined potential is always applied. The charges detected by the second optical conversion element 2009 are amplified by the AEC sensor reading device 2010 through a drain line 2013. The outputs are totalized to detect the total incident amount of the radiation.

The layer structure of the radiation imaging apparatus according to this embodiment will be described next with reference to FIG. 8A.

First, the TFT 2007 and second optical conversion element 2009 to be used as an AEC sensor are formed on a glass substrate 2100. A first conductive layer 2101 is formed by sputtering. The gate electrode and gate line (e.g., AlNd/Mo: 2,500 Å) of the TFT and second optical conversion element, a first insulating layer 2102 (e.g., SiN: 3,000 Å), and a first semiconductor layer (first optical absorption layer) 2103 (e.g., a-Si: 5,000 Å) are continuously formed by CVD.

The transfer rate of the TFT 2007 is preferably high. The first semiconductor layer 2103 is preferably thin. For these reasons, the first semiconductor layer 2103 corresponding to only the TFT portion is thinned by half etching. Subsequently, a first ohmic contact layer 2105 (e.g., a-Si (n+): 200 Å) is formed by CVD, and a second conductive layer 2106 (e.g., Mo/Al/Mo: 4,000 Å) is formed by sputtering, thereby forming the source and drain electrodes and interconnections.

To protect especially the channel portion of the TFT 2007, a second insulating layer 2104 (e.g., SiN: 2,000 Å) is formed by CVD. In addition, a third insulating layer 2107 (e.g., organic film BCB (benzocyclobutene)) serving as a protective layer is formed on the resultant structure.

A third conductive layer 2108 (e.g., Mo/Al/Mo: 4,000 Å) is formed by sputtering and connected to the source or drain electrode of the TFT 2007 through a contact hole. The third conductive layer 2108 is also separated into the lower electrodes of the first optical conversion elements in correspondence with the respective pixels while preventing the third conductive layer 2108 from remaining on the TFT portions. An n-type semiconductor layer 2114 (e.g., a-SI (P): 1,000 Å), a hiqh-resistant semiconductor layer (second optical absorption layer) 2115 (e.g., a-Si: 5,000 Å), and a p-type semiconductor layer 2116 (e.g., a-Si (N): 1,000 Å) are continuously formed on the resultant structure by CVD. In addition, a fourth conductive layer 2112 (e.g., Mo/Al/Mo: 4,000 Å) is formed by sputtering to form the bias line of the first optical conversion element.

To separate the pixels and ensure the optical propagation path to the second optical conversion element 2009, the n-type semiconductor layer 2114, high-resistant semiconductor layer (second optical absorption layer) 2115, and p-type semiconductor layer 2116 are dry-etched (element-isolated) into a shape along the lower electrode of the first optical conversion element. In this embodiment, as shown in FIG. 8A, the n-type semiconductor layer 2114, high-resistant semiconductor layer (second optical absorption layer) 2115, and p-type semiconductor layer 2116 are element-isolated into a shape along the lower electrode of the first optical conversion element. However, it is more preferable to form an optical propagation area having a stripe shape along the source and drain lines of the second optical conversion element, as in the first embodiment, because the opening ratio of the first optical conversion element increases. After that, a protective layer 2118 (e.g., SiN and organic film) and phosphor layer 2119 are formed on the upper surface.

In this embodiment, a PIN optical conversion element is used as the first optical conversion element. A MIS optical conversion element may be used, as a matter of course. In this embodiment, a TFT optical conversion element constituted by three elements, i.e., a gate, source, and drain is used as the second optical conversion element. However, sufficient performance can be obtained even with a structure having no gate.

When the gate lines of the second optical conversion elements are arranged in the gaps between the lower electrodes of the first optical conversion elements, as shown in FIG. 6, generation of any parasitic capacitance between the gate electrodes 2015 and the first optical conversion elements can be avoided. This is advantageous in terms of noise and the like. When the gate lines are arranged immediately under the lower electrodes of the first optical conversion elements, as shown in FIGS. 7 and 8B, the lower electrode area of the first optical conversion elements can be increased. Hence, the signal improves. In this embodiment, the portions above the TFTs 2007 are removed from the formation areas of the first optical conversion elements 2008. When the optical leakage current of the TFTs is taken into consideration, the first optical conversion elements may be formed even at the portions above the TFTs, as shown in FIG. 4A of the first embodiment, to decrease the light incidence on the TFTS.

According to this embodiment, the AEC sensors (second optical conversion elements) are formed on the substrate of the imaging radiation detector simultaneously. For this reason, the separate radiation automatic exposure controller (AEC) need not be separately arranged. The radiation imaging apparatus can be made compact.

According to this embodiment, it is effective from the viewpoint of cost because the substrate preparation process of the imaging radiation detector is directly used.

Conventionally, separate AEC sensors are arranged in front of the imaging radiation detector. In this embodiment, however, since the AEC sensors (second optical conversion elements) are formed without any influence on the opening ratio of the first optical conversion elements for imaging, the image quality does not degrade.

According to this embodiment, the second optical conversion element in the narrow area between the first optical conversion elements is formed in correspondence with a plurality of pixels (e.g., 200×200 pixels) and electrically connected. For this reason, a sufficient output can be extracted as an AEC sensor.

(Third Embodiment)

As the third embodiment of the present invention, an example will be described with reference to the accompanying drawings, in which in an imaging radiation detector that constitutes a radiation imaging apparatus, when switching TFTs 3007 are formed, and a typical radiation direct detection material (first radiation conversion elements) such as amorphous selenium (a-Se) or gallium arsenide (GaAs) is formed on the switching TFTs via an organic insulating film, AEC sensors (second radiation conversion elements) are formed in the gaps between the first radiation conversion elements.

Figure 9:
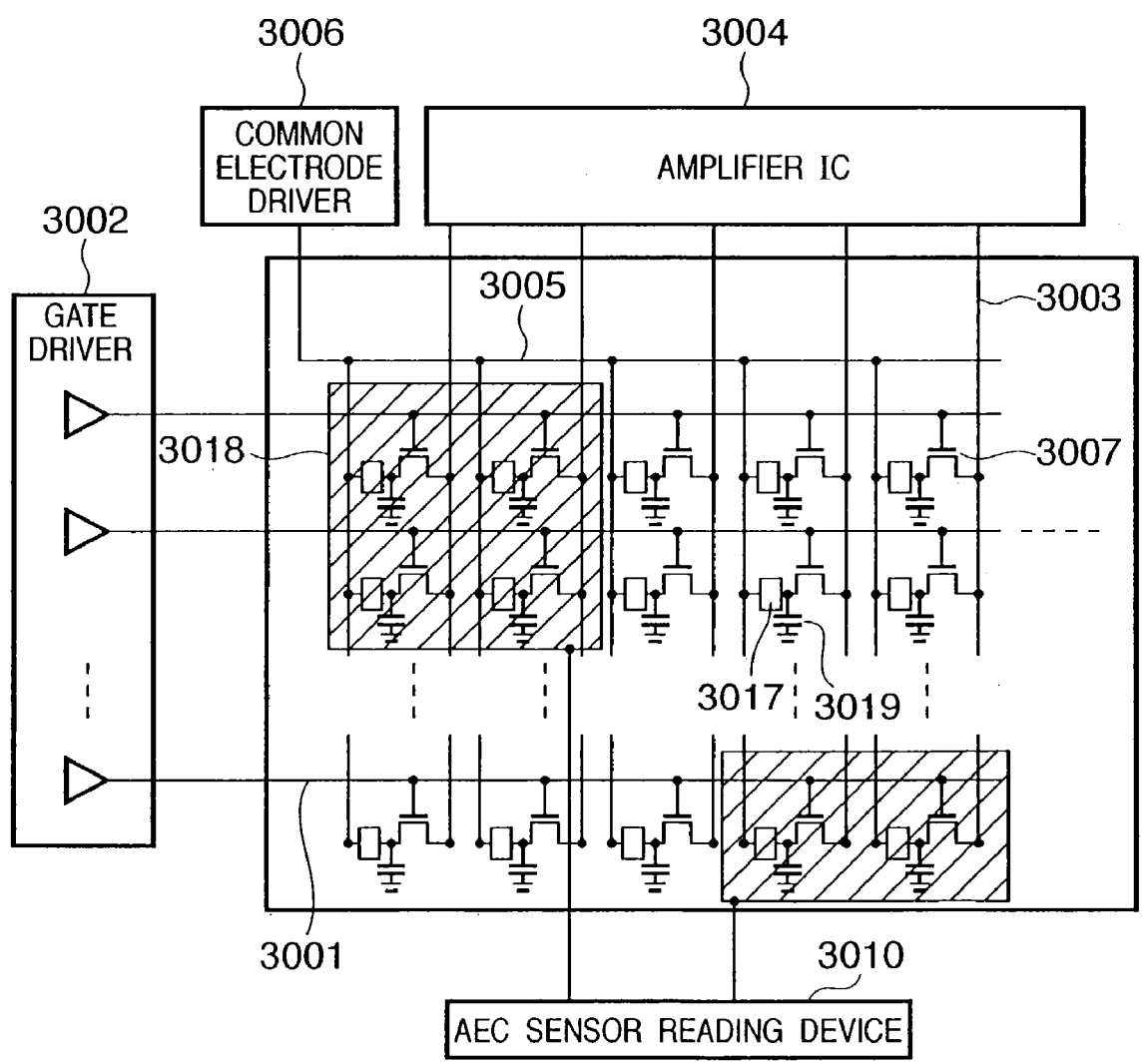
FIG. 9 is a schematic equivalent circuit diagram showing a radiation imaging apparatus according to the third embodiment of the present invention.
Figure 10:
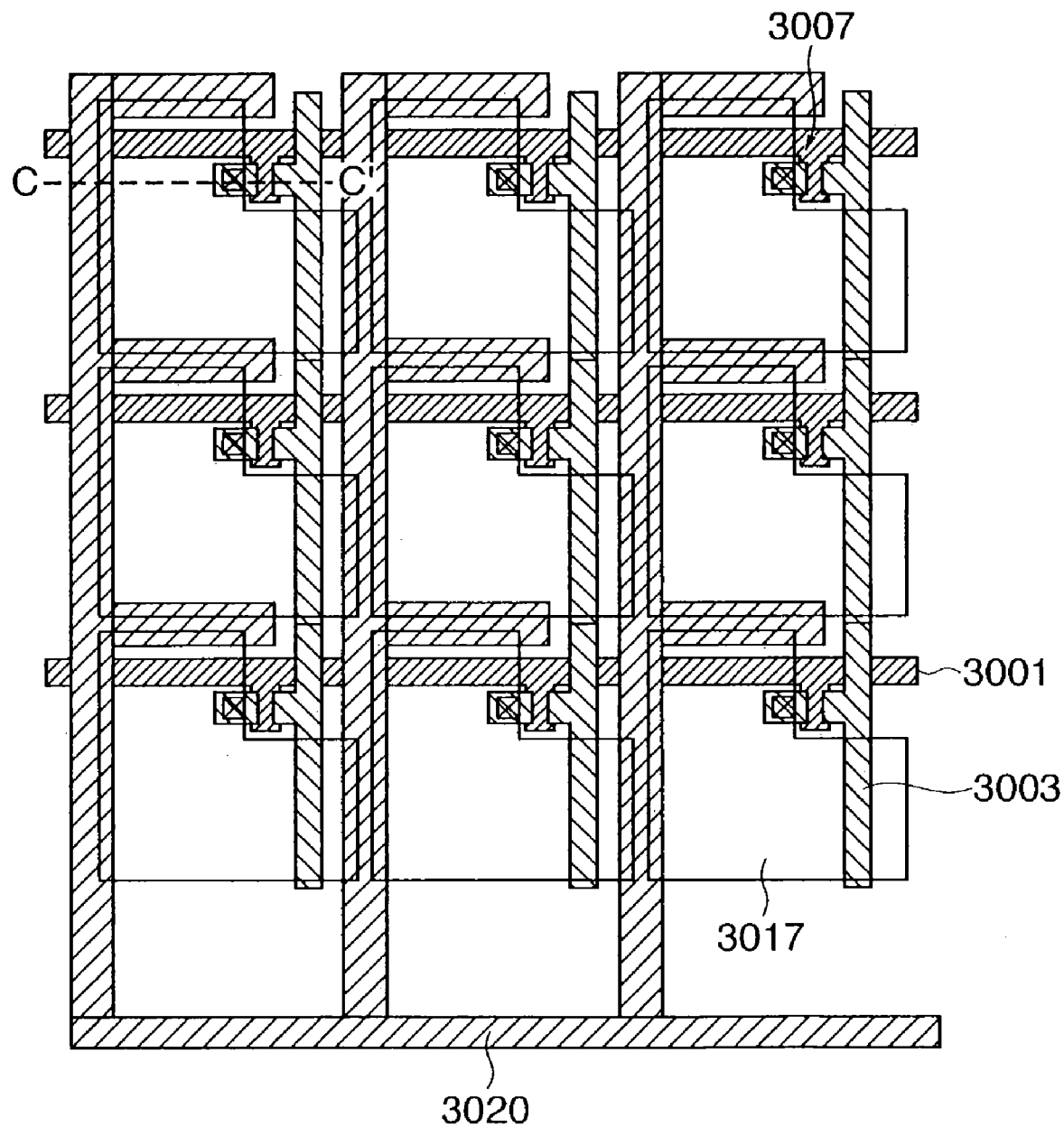
FIG. 10 is a schematic plan view showing the radiation imaging apparatus according to the third embodiment of the present invention.
Figure 11:
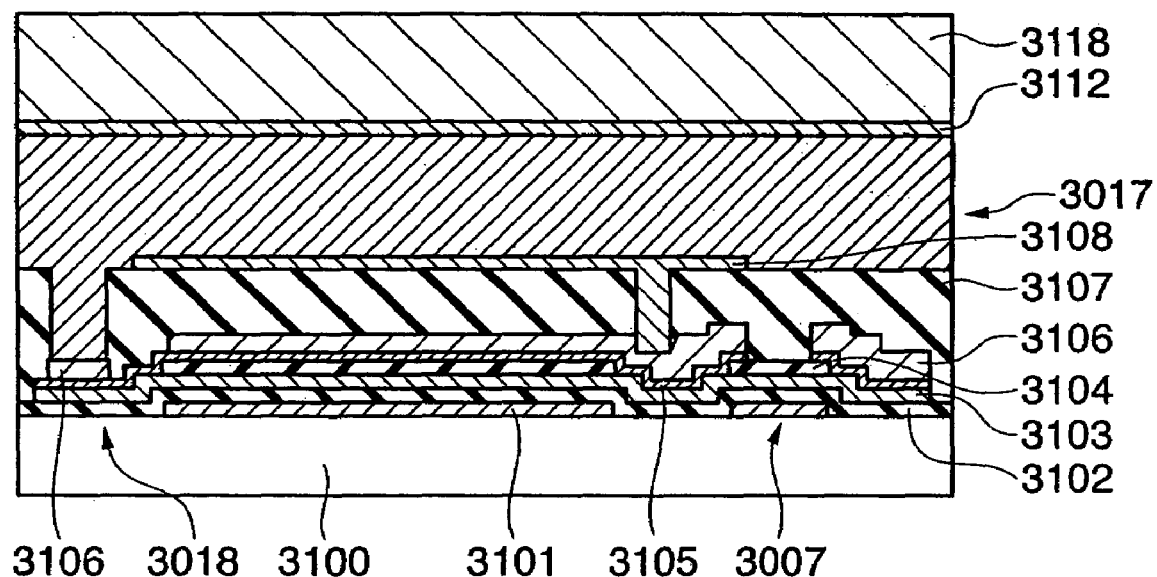
FIG. 11 is a schematic sectional view showing one pixel area of the radiation imaging apparatus according to the third embodiment of the present invention.
Figure 12:
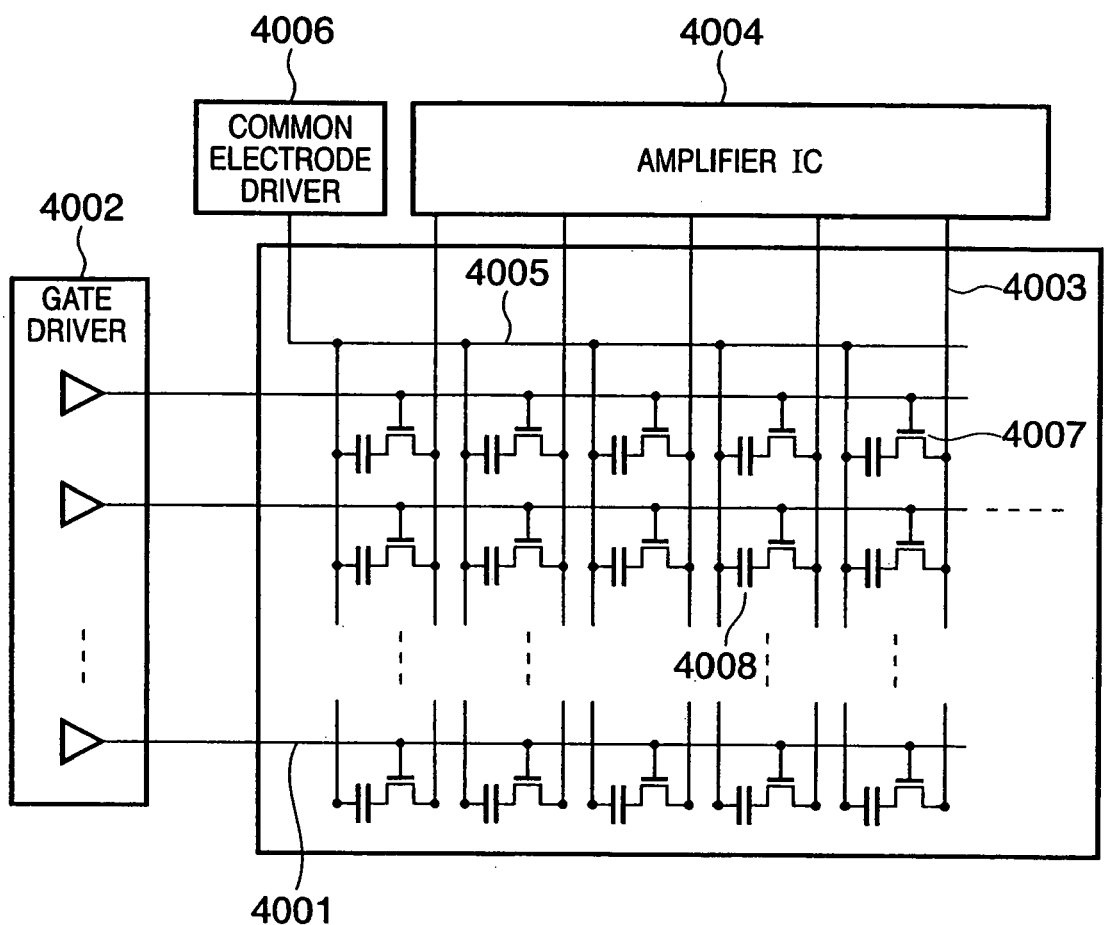
FIG. 12 is an equivalent circuit diagram showing a conventional imaging radiation detector.
Figure 13:
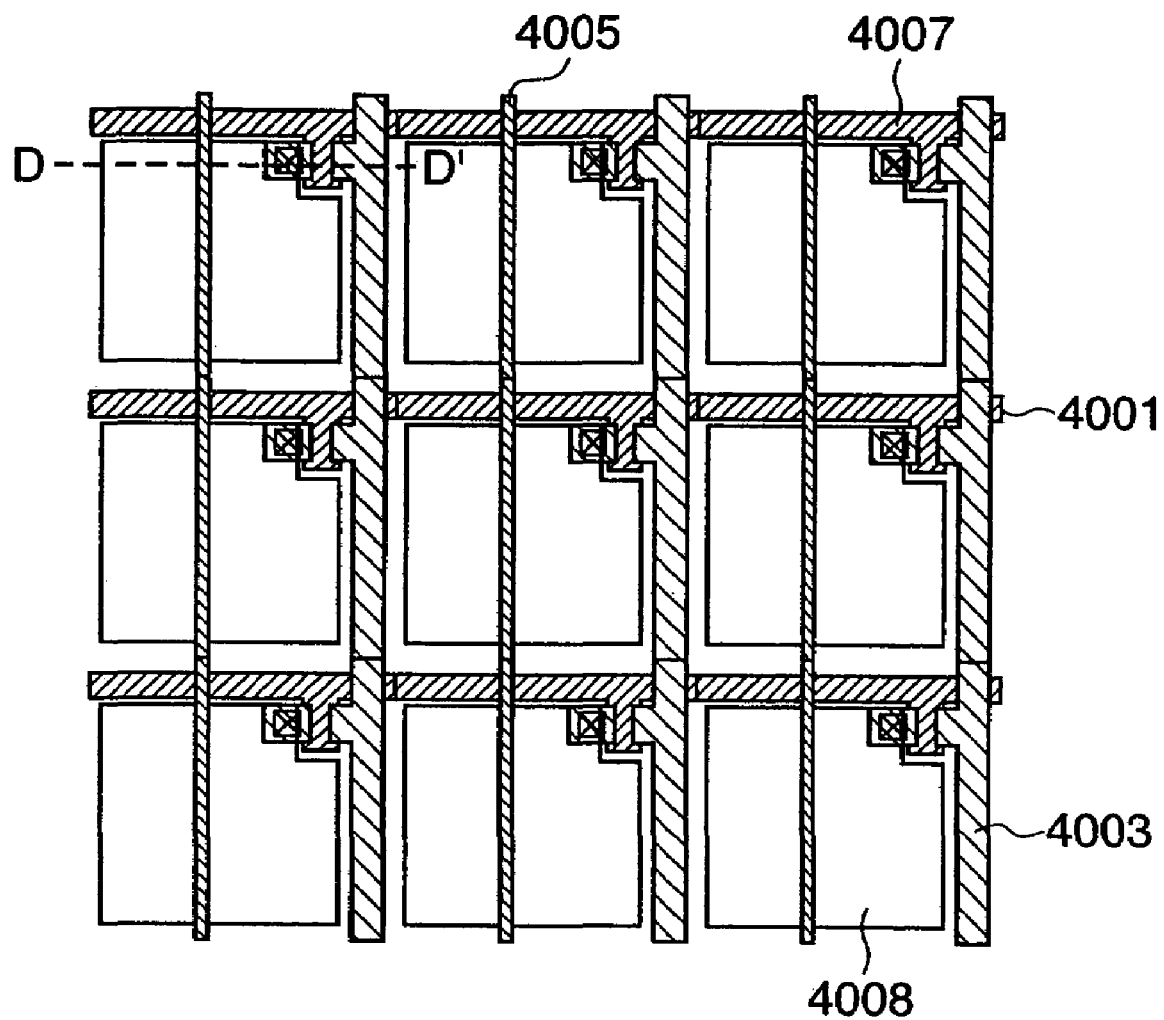
FIG. 13 is a plan view showing the conventional imaging radiation detector.
Figure 14:
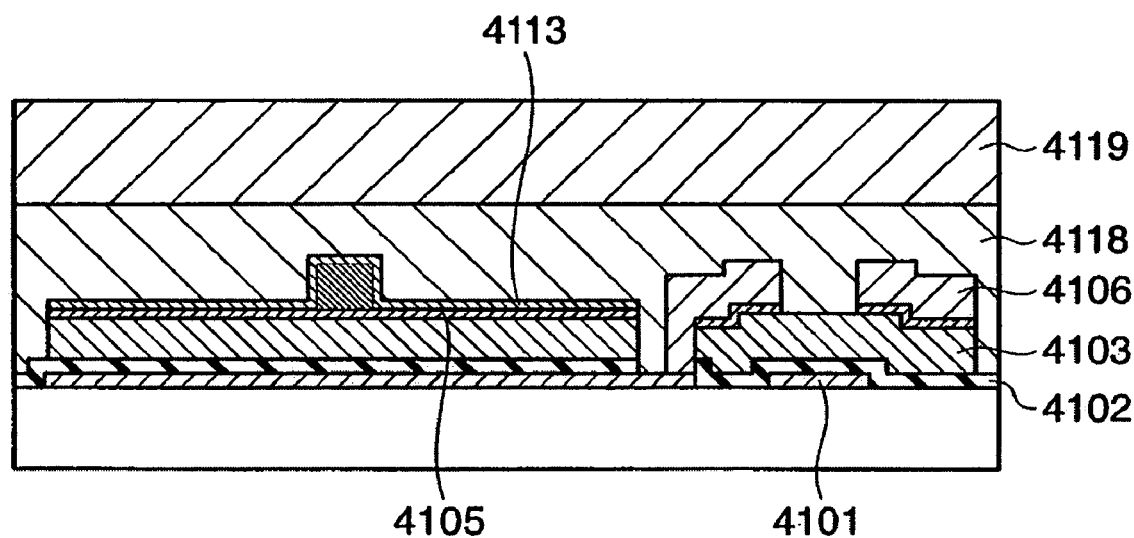
FIG. 14 is a sectional view schematically showing the layer structure of one pixel area which is formed from a MIS optical conversion element and a switching TFT.
Figure 15:
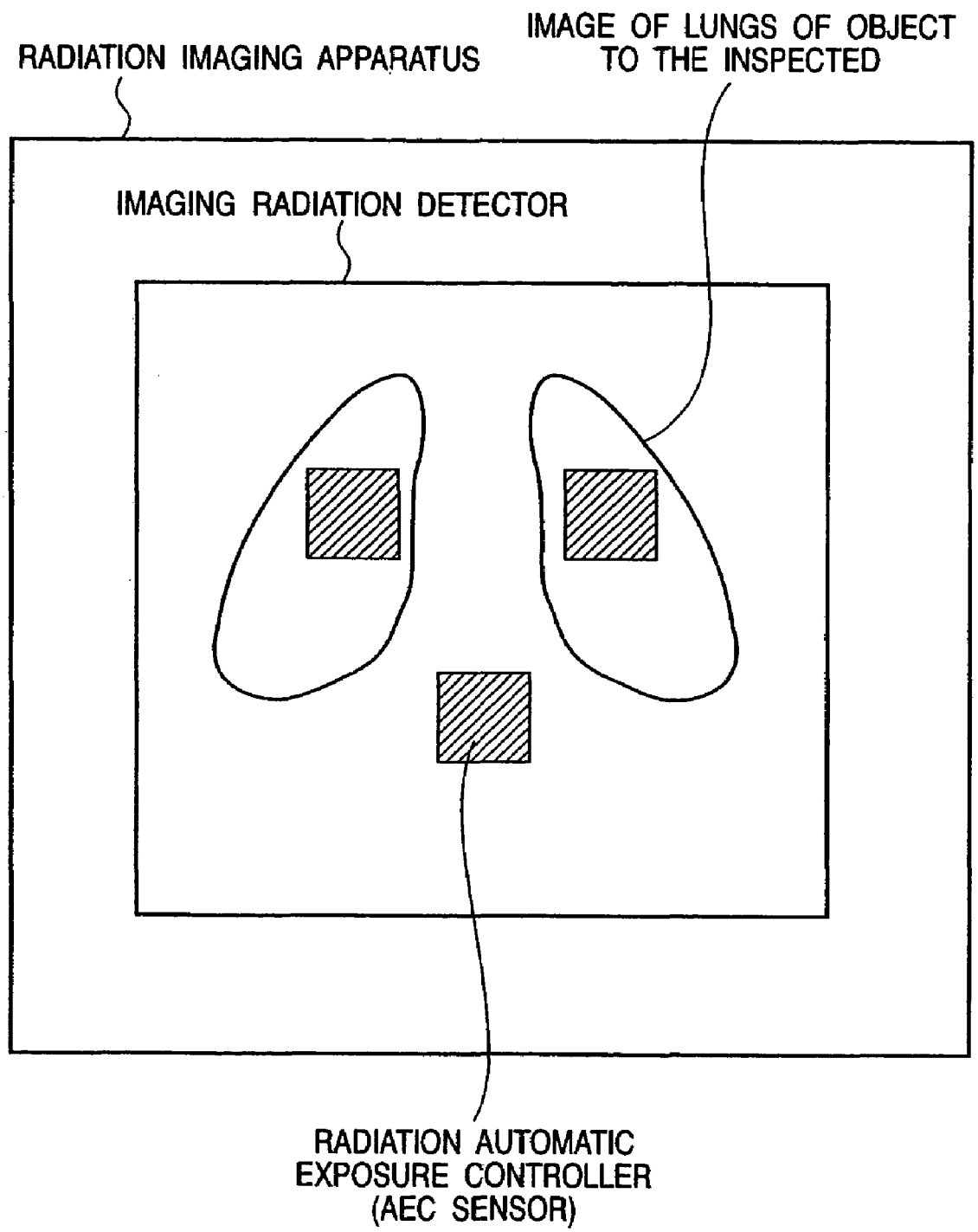
FIG. 15 is a view showing the imaging radiation detector and a radiation automatic exposure controller (AEC), which constitute a conventional radiation imaging apparatus.

FIG. 9 is a schematic equivalent circuit diagram of a radiation imaging apparatus according to this embodiment. FIG. 10 is a schematic plan view of the radiation imaging apparatus according to this embodiment. FIG. 11 is a schematic sectional view of one pixel area (at a position corresponding to a line C–C' in FIG. 10) of the radiation imaging apparatus according to this embodiment.

The operation of this embodiment will be described with reference to FIGS. 9 and 10. Reference numeral 3017 denotes a semiconductor conversion element such as a first radiation conversion element; and 3007, a switching TFT. The semiconductor conversion element 3017 and switching TFT 3007 constitute a pixel. A second radiation conversion element 3018 is formed in correspondence with a plurality of pixels. The second radiation conversion element 3018 and first radiation conversion element 3017 share bias lines 3005. A lower electrode interconnection 3020 unique to the second radiation conversion element 3018 is connected to an AEC sensor reading device 3010. Actually, for example, 2,000×2,000 pixels are laid out on an insulating substrate. As for the second radiation conversion element 3018, actually, for example, one second optical conversion element is formed in correspondence with 200 ×200 pixels. At least three second optical conversion elements are arranged in the panel.

Radiation that becomes incident on an object to be inspected passes through the object to be inspected while being attenuated by it and strikes the first radiation conversion element 3017 (e.g., a-Se). When radiation is input to the a-Se element, positive and negative charges are generated by the photoconductive effect in accordance with the incident radiation energy. When a voltage of several kV is applied across the a-Se element by using the bias line 3005 connected to a common electrode driver 3006, the generated charges can be extracted as a flux along the electric field. The charges generated by the first radiation conversion element 3017 for imaging are stored in a storage capacitor 3019 arranged on an insulating substrate. The stored charges are transferred to a signal line 3003 through the TFT 3007 and read out to the outside by an amplifier IC 3004. The gate electrodes of the TFTs 3007 are connected to common gate lines 3001 (Vg). The gate lines 3001 are connected to a gate driver 3002 which ON/OFF-controls the TFTs.

On the other hand, the second radiation conversion element 3018 is sandwiched between the bias line 3005 (upper electrode) and the lower electrode interconnection 3020. When a predetermined potential is always applied to the second radiation conversion element, it can output charges corresponding to the incident light amount. The generated charges are directly connected and amplified to the AEC sensor reading device 3010 through the lower electrode. The outputs are totalized to detect the total incident amount of the radiation.

The layer structure of the radiation imaging apparatus according to this embodiment will be described next with reference to FIG. 11.

First, a first conductive layer 3101 is formed on a glass substrate 3100 by sputtering to form the gate electrode and gate line of the TFT 3007 and the lower electrode of the storage capacitor for the second radiation conversion element (e.g., AlNd/Mo: 2,500 Å). A first insulating layer 3102

(e.g., SiN: 3,000 Å), a first semiconductor layer (first optical absorption layer) 3103 (e.g., a-Si: 1,500 Å), and a second insulating layer 3104 (e.g., SiN: 2,000 Å) are continuously formed on the resultant structure by CVD. The second insulating layer is formed on the first conductive layer by back exposure as the protective film between the sources and the drains of the TFTs.

Subsequently, a first ohmic contact layer 3105 (e.g., a-Si (n+): 200 Å) is formed by CVD, and a second conductive layer 3106 (e.g., Mo/Al/Mo: 4,000 Å) is formed by sputtering, thereby forming the source and drain electrodes, interconnections, and the lower electrode interconnection 3020 of the second radiation conversion element. A third insulating layer 3107 (e.g., organic film BCB (benzocyclobutene)) serving as a protective layer is formed on the resultant structure. A contact hole portion on the source or drain electrode of the TFT 3007 and the third insulating layer corresponding to the lower electrode portion of the second radiation conversion element are removed by etching.

A third conductive layer 3108 (e.g., Cu: 2,000 Å) is formed by sputtering and connected to the source or drain electrode of the TFT through a contact hole. The third conductive layer, 3108 is also separated into the lower electrodes of the first optical conversion elements in correspondence with the respective pixels. A fourth conductive layer 3112 (e.g., Mo/Al/Mo: 4,000 Å) is formed by sputtering. After that, a protective layer 3118 (e.g., SiN and organic film) is formed on the upper surface.

In this embodiment, charges generated by the second radiation conversion element used as the AEC sensor are directly read out through the lower electrode interconnection 3020. When an electrode unique to the first conductive layer is formed, the charges can also be stored or read out. In this embodiment, as shown in FIG. 10, portions above the TFTs 3007 are removed from the formation areas of the first radiation conversion elements (the lower electrodes of the first radiation conversion elements) 3017. When the optical leakage current of the TFTs 3007 is taken into consideration, the first radiation conversion elements may be formed even at the portions above the TFTs, as shown in FIG. 4A of the first embodiment, to decrease the light incidence on the TFTs.

According to this embodiment, the AEC sensors (second radiation conversion elements) are formed on the substrate of the imaging radiation detector simultaneously. For this reason, the radiation automatic exposure controller (AEC) need not be separately arranged. The radiation imaging apparatus can be made compact.

In this embodiment, it is effective from the viewpoint of cost because the substrate preparation process of the imaging radiation detector is directly used.

Conventionally, separate AEC sensors are arranged in front of the imaging radiation detector. In this embodiment, however, since the AEC sensors (second radiation conversion elements) are formed without any influence on the opening ratio of the first radiation conversion elements for imaging, the image quality does not degrade.

According to this embodiment, the second radiation conversion element in the narrow area between the first radiation conversion elements is formed in correspondence with a plurality of pixels (e.g., 200×200 pixels) and electrically connected. For this reason, a sufficient output can be extracted as an AEC sensor.

Hence, an inexpensive compact radiation imaging apparatus which has a function (AEC function) of detecting and adjusting the amount of incident radiation at a sufficient sensitivity without degrading the image quality can be implemented. More specifically, since a detection means is arranged at below the conversion means, any detection means separated from the radiation imaging apparatus need not be prepared. If the detection means is arranged on the radiation imaging apparatus, as in the prior art, the image quality degrades because the conversion means receives radiation that is attenuated by the detection means. This can be avoided in this embodiment. Furthermore, since the detection means and conversion means are arranged in a multilayered structure, the apparatus main body can be made compact.

(Fourth Embodiment)

In this embodiment, a control electrode 21 is connected to an adjacent gate line 20. In addition, a lead interconnection 25 for the control electrode 21 is omitted. With this structure, the light-receiving area (opening ratio) of a monitor photoelectric conversion element 2 and the light-receiving area (opening ratio) of an image sensing photoelectric conversion element 1 in a pixel having lead interconnections can be increased, and the characteristics can be improved.

Figure 23:
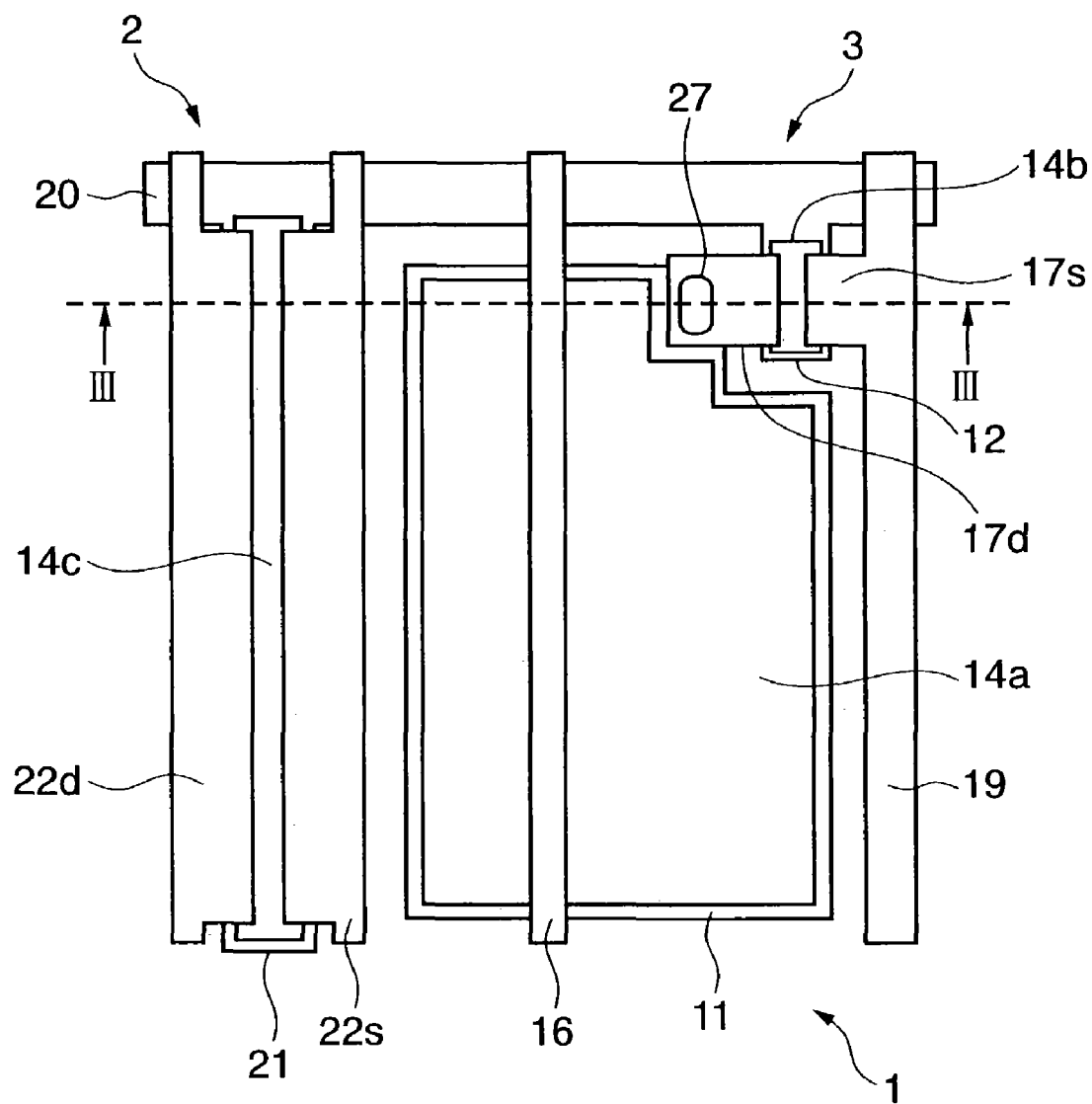
FIG. 23 is a layout diagram showing the planar structure of a pixel of a radiation image sensing apparatus according to the fourth embodiment of the present invention, which has a monitor photoelectric conversion element.
Figure 24:
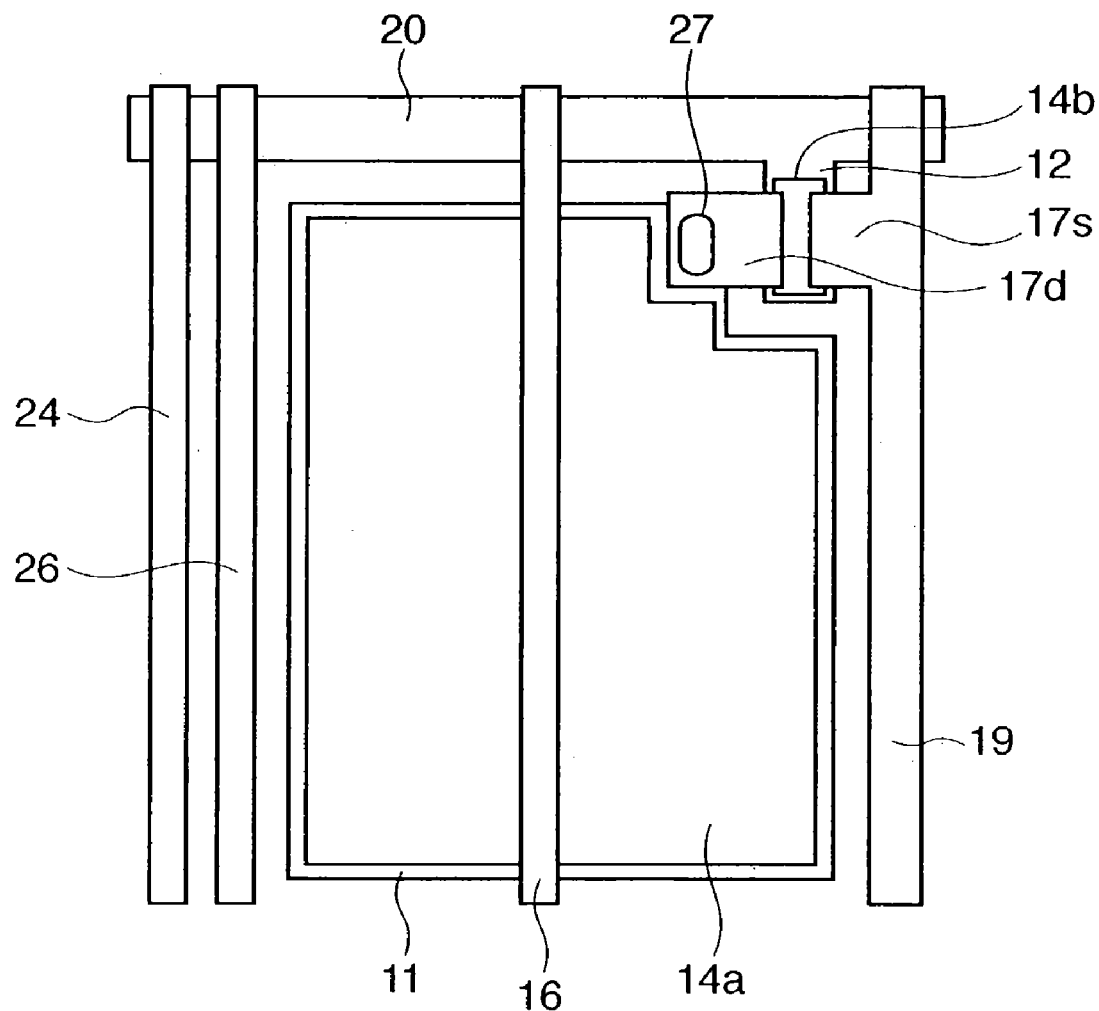
FIG. 24 is a layout diagram showing the planar structure of a pixel of the radiation image sensing apparatus according to the fourth embodiment, which has lead interconnections for a monitor photoelectric conversion element.
Figure 25:
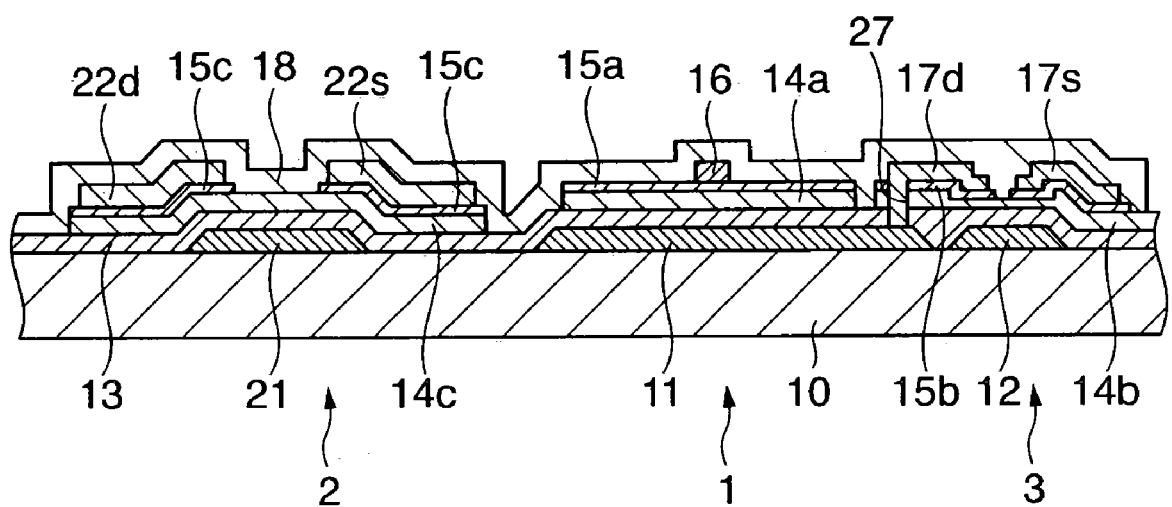
FIG. 25 is a sectional view taken along a line III—III in FIG. 23.

FIG. 23 is a layout diagram showing the planar structure of a pixel of a radiation image sensing apparatus according to this embodiment, which has a monitor photoelectric conversion element. FIG. 24 is a layout diagram showing the planar structure of a pixel of the radiation image sensing apparatus according to this embodiment, which has lead interconnections for a monitor photoelectric conversion element. FIG. 25 is a sectional view taken along a line III—III in FIG. 23.

In this embodiment, in the pixel having the monitor photoelectric conversion element, the control electrode 21 is connected to the gate line 20, as shown in FIGS. 23 and 25. A control electrode 12 of a switching TFT 3 formed in the same pixel is also connected to the gate line 20.

Pixels each having the above structure are collectively laid out. For example, a drain electrode 22d, source electrode 22s, common electrode bias line 16, and signal line 19 are shared by the pixels.

As shown in FIG. 24, in a pixel having lead interconnections for the monitor photoelectric conversion element, an interconnection 24 for the drain electrode 22d and an interconnection 26 for the source electrode 22s are formed. However, no interconnection for the control electrode 21 is formed, unlike the reference example. This is because the control electrode 21 is connected to the gate line 20. The source electrode 22s and drain electrode 22d are led to the outside of the panel by the interconnections 24 and 26, respectively.

A pixel having neither a monitor photoelectric conversion element nor lead interconnections therefor has the same structure as that of the pixel shown in FIGS. 18 and 21.

The pixel shown in FIGS. 23 and 25 will be compared with that shown in FIGS. 18 and 19. The shape and area of the pixel are the same. In the pixel shown in FIGS. 23 and 25, since the monitor photoelectric conversion element 2 is formed, the light-receiving area (opening ratio) of the image sensing photoelectric conversion element 1 accordingly decreases. The pixel shown in FIG. 24 will be compared with that shown in FIGS. 18 and 21. The shape and area of the pixel are the same. Since the interconnections 24 and 26 are formed, the light-receiving area (opening ratio) of the image sensing photoelectric conversion element 1 accordingly decreases.

The pixels are laid out as shown in FIG. 17. More specifically, areas R2 where a plurality of pixels each made of a pair of monitor photoelectric conversion element and image sensing photoelectric conversion element are formed are laid out at the four corners and near the center of a conversion section T having a two-dimensional rectangular shape. In this embodiment, monitor photoelectric conversion elements are formed in 20 (rows)×3 (columns) pixels in each area R2.

A method of driving the radiation image sensing apparatus according to this embodiment, which has the above-described arrangement, will be described next.

First, as described above, a voltage is applied from a power supply 53 to the source electrode 22s of the monitor photoelectric conversion element 2 to apply a potential between the source and the drain. In addition, the depletion voltage of a semiconductor layer, i.e., the OFF voltage of the TFT 3 is applied from the gate line 20 to the control electrode 21 to prevent a dark current and increase the electron/hole collection efficiency.

In this state, the phosphor layer (not shown) is irradiated with X-rays. The photoelectric conversion section is irradiated with visible light from the phosphor layer. The visible light absorbed by the monitor photoelectric conversion element 2 is converted into charges and transported to a monitor signal processing circuit 54 through the drain electrode 22d. For this reason, the charge amount can be measured in real time as an X-ray dose.

When the X-ray dose measured by the monitor signal processing circuit 54 reaches a set value, a signal is sent to the X-ray generator to stop X-ray irradiation. Immediately after that, the operating voltage of the TFT 3 is sequentially applied to the gate lines 20 of the TFTs 3, thereby reading charges stored in the capacitors of the image sensing photoelectric conversion elements 1 from signal lines 19.

At this time, a forward voltage (operating voltage of the TFT 3) is applied from the control electrode 21, which is connected to the gate line 20 to which the operating voltage is applied, to a semiconductor layer 14c of the monitor photoelectric conversion element 2. Hence, charges stored in the interface between an insulating film 13 and the semiconductor layer 14c in the monitor photoelectric conversion element 2 in correspondence with the X-ray dose can be removed.

In this embodiment, the monitor photoelectric conversion element 2 has no through hole for the upper interconnection. Hence, the light-receiving area (opening ratio) is large. As for a pixel having lead interconnections, three lead interconnections 24 to 26 are formed in the reference example. In this embodiment, however, the lead interconnection 25 for the control electrode is not formed. Instead, only the two lead interconnections 24 and 26 are formed. Hence, according to this embodiment, the light-receiving area (opening ratio) of the image sensing photoelectric conversion element 1 in this pixel is large. Furthermore, in this embodiment, since the circuit that drives the potential of the control electrode 21 is unnecessary, the circuit is simplified.

Some pixels may have no image sensing photoelectric conversion elements 1 and only the monitor photoelectric conversion elements 2 and lead interconnections for the monitor photoelectric conversion elements 2 in adjacent pixels.

Alternatively, only the pixels of one line in each area R2, and for example, only 20 (rows)×1 (column) pixels or 1 (row)×3 (columns) pixels in the area R2 may have the monitor photoelectric conversion elements.

A method of manufacturing the radiation image sensing apparatus according to this embodiment will be described next. FIGS. 26A to 26D and 27A to 27C are sectional views showing steps in manufacturing the radiation image sensing apparatus according to this embodiment.

Figure 26A:
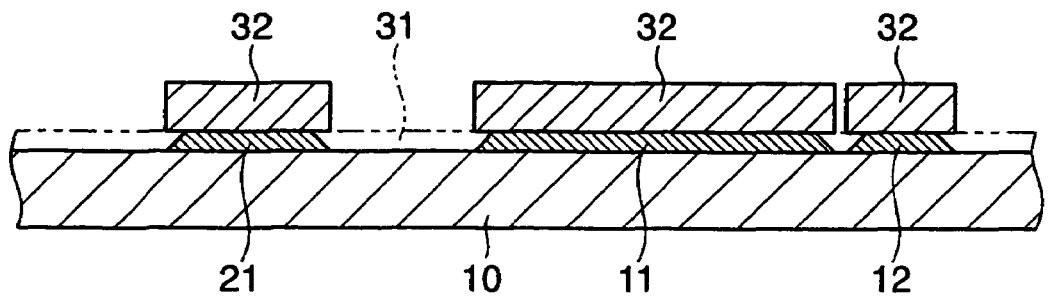
FIGS. 26A to 26D are sectional views showing steps in manufacturing the radiation image sensing apparatus according to the fourth embodiment of the present invention.

First, as shown in FIG. 26A, an AlNd film 31 serving as a first metal layer and having a thickness of 500 to 4,000 Å is formed on an insulating substrate 10 by, e.g., sputtering. An Mo film or Ta film may be formed as the first metal layer. Alternatively, a multilayered film may be formed by sequentially forming a plurality of films. Next, the AlNd film 31 is patterned by photolithography using a resist film 32 as a mask to form a sensor electrode 11, the control electrodes 12 and 21, and a gate line 20. Etching of the AlNd film 31 is done by a wet process using an etchant containing, e.g., nitric acid, phosphoric acid, and acetic acid. After patterning, the resist film 32 is removed.

Figure 26B:
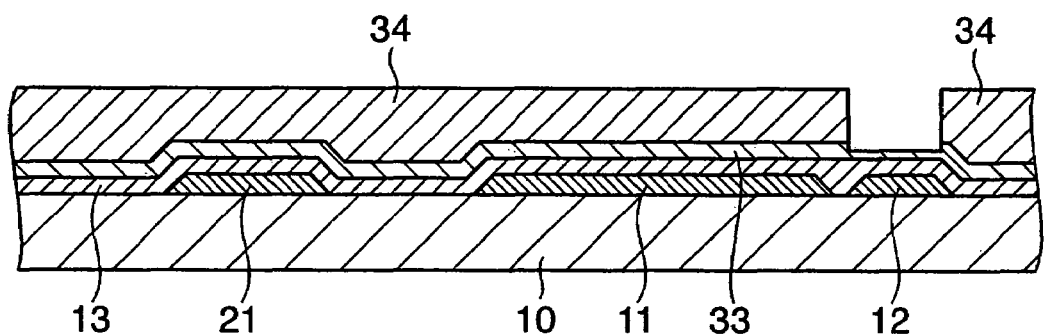

As shown in FIG. 26B, the first insulating film 13 having a thickness of 1,500 to 4,000 Å and a semiconductor layer 33 having a thickness of 2,000 to 15,000 Å are continuously formed by CVD. The semiconductor layer 33 becomes a semiconductor layer (photoelectric conversion layer) 14a of the image sensing photoelectric conversion element 1, a semiconductor layer 14b of the TFT 3, and the semiconductor layer (photoelectric conversion layer) 14c of the monitor photoelectric conversion element 2. As the first insulating film 13, for example, an SiN film is used.

Then, the semiconductor layer 33 is etched by 500 to 5,000 Å by photolithography using a resist film 34 having an opening on the control electrode 12 of the TFT 3 as a mask. The semiconductor layer 33 is formed as thick as 2,000 to 15,000 Å to increase the optical absorption efficiency in the image sensing photoelectric conversion element 1 and monitor photoelectric conversion element 2. In this state, the series resistance between the source and the drain of the TFT 3 is high. Hence, the process for thinning the semiconductor layer 33 is executed to reduce the ON resistance of the TFT 3. At this time, the semiconductor layer 33 is etched by, e.g., dry etching. As dry etching, plasma etching is preferably used because a high process accuracy can be obtained while minimizing damage to the semiconductor layer 33. Chemical dry etching which can also minimize damage to the semiconductor layer 33 may be used. Alternatively, reactive etching at a low power (e.g., about 0.1 to 0.2 W/cm$^2$) and high pressure (e.g., about 10 to 30 Pa) may be performed. After patterning, the resist film 34 is removed.

Figure 26C:
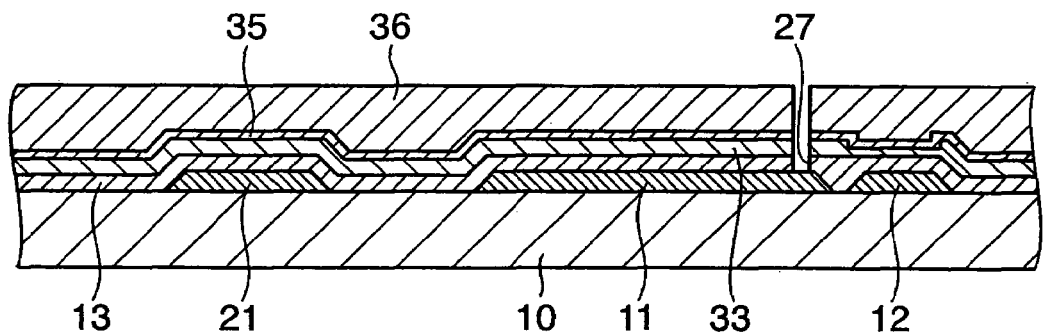

As shown in FIG. 26C, an ohmic contact layer 35 having a thickness of 100 to 1,000 Å is formed by CVD. If silicon oxide is present in the interface between the semiconductor layer 33 and the ohmic contact layer 35, a preprocess using hydrofluoric acid (e.g., about 0.1 to 10 wt %) may be executed. If an organic film is inserted, it may be removed by irradiating it with oxygen plasma. In addition, a final process using hydrogen plasma may be executed in the CVD apparatus immediately before formation of the ohmic contact layer 35.

Next, a through hole 27 is formed by photolithography using a resist film 36 as a mask. The through hole 27 electrically connects a drain electrode 17d of the TFT 3 to the sensor electrode 11 of the image sensing photoelectric conversion element 1. Charges generated when the light-receiving portion absorbs visible light are read, through the drain electrode 17d, from the sensor electrode 11 capacitively coupled to the light-receiving portion.

To improve the coverage of a metal film to be formed later, chemical dry etching is preferably performed to form a hole having a tapered section. If the coverage of the metal film need not taken into consideration, the process accuracy may be increased by reactive ion etching. Alternatively, the hole may be formed by plasma etching. After patterning, the resist film 36 is removed.

Figure 26D:
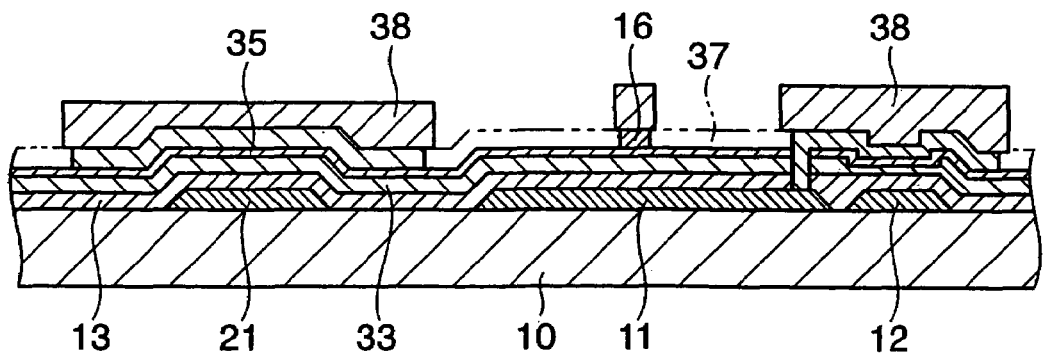

As shown in FIG. 26D, an Al film 37 serving as a second metal layer and having a thickness of 1,000 to 4,000 Å is formed by, e.g., sputtering. An Mo film or Ta film may be formed as the second metal layer. Alternatively, a multilayered film may be formed by sequentially forming a plurality of films. If an oxide film is formed on the surface of the through hole 27, and satisfactory connection to the through hole 27 cannot be ensured, a process for removing the oxide film by reverse sputtering is inserted before formation of the Al film 37.

The Al film 37 is patterned by photolithography using a resist film 38 as a mask to form a common electrode bias line 16. Etching of the Al film 37 is done by a wet process using an etchant containing, e.g., nitric acid, phosphoric acid, and acetic acid. Hence, the Al film 37 is etched slightly inward under the resist film 38. In this patterning, the Al film 37 in regions where the source electrodes 17s and 22s, drain electrodes 17d and 22d, and signal line 19 are to be formed is masked by the resist film 38 to prevent etching in this process. After patterning, the resist film 38 is removed.

Figure 27A:
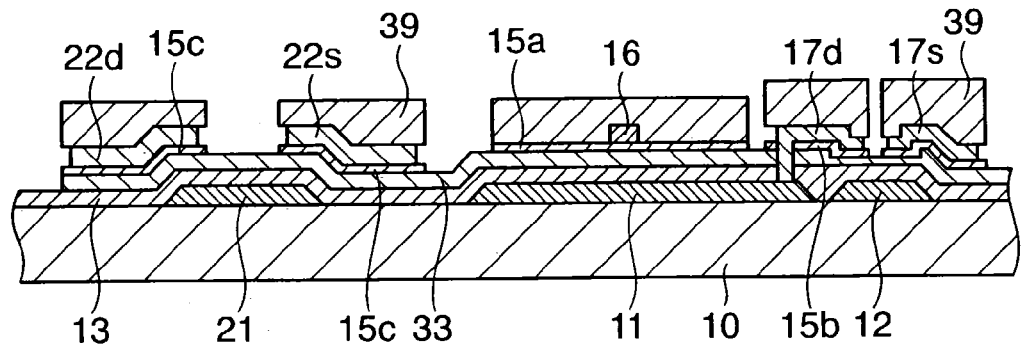
FIGS. 27A to 27C are sectional views showing steps in manufacturing the radiation image sensing apparatus according to the fourth embodiment of the present invention, which show the steps next to those shown in FIGS. 26A to 26D.

After that, as shown in FIG. 27A, the Al film 37 is patterned by photolithography using a new resist film 39 as a mask to form the source electrodes 17s and 22s, drain electrodes 17d and 22d, and signal line 19. Etching of the Al film 37 is done by a wet process using an etchant containing, e.g., nitric acid, phosphoric acid, and acetic acid. Hence, the Al film 37 is etched slightly inward under the resist film 39.

At this time, the common electrode bias line 16 that has already been formed is masked by the resist film 39 to prevent etching in this process. In addition, to prevent the ohmic contact layer 35 in the opening region of the image sensing photoelectric conversion element 1 from being removed by dry etching of the next process, not only the common electrode bias line 16 but also the entire opening region of the image sensing photoelectric conversion element 1 is masked by the resist film 39.

As shown in FIG. 27A, dry etching is performed using the resist film 39 as a mask to remove the gap portions of the TFT 3, i.e., the ohmic contact layer 35 between the sources and the drains, thereby forming ohmic contact layers 15a to 15c.

Figure 27B:
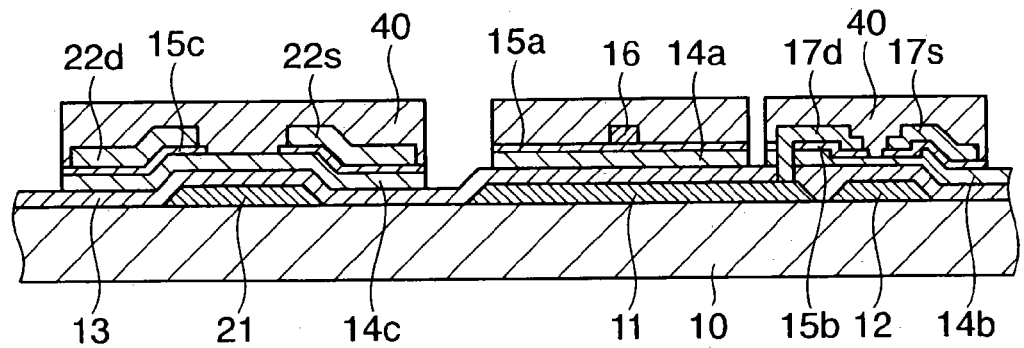

As shown in FIG. 27B, unnecessary portions of the semiconductor layer 33 and ohmic contact layer 35 are removed by photolithography using a resist film 40 as a mask to define the opening region of the image sensing photoelectric conversion element 1 and form the semiconductor layers 14a to 14c. After patterning, the resist film 40 is removed.

The unnecessary portions of the first insulating film 13 are not removed in this embodiment. However, they may be removed. When the first insulating film 13 is left without being removed, the etching process for removing the unnecessary portions of the semiconductor layer 33 and ohmic contact layer 35 is preferably executed by using plasma etching in order to ensure the process accuracy because the selectivity ratio between the semiconductor layer 33 and the SiN film that constitutes the first insulating film 13 can readily be ensured in plasma etching.

Figure 27C:
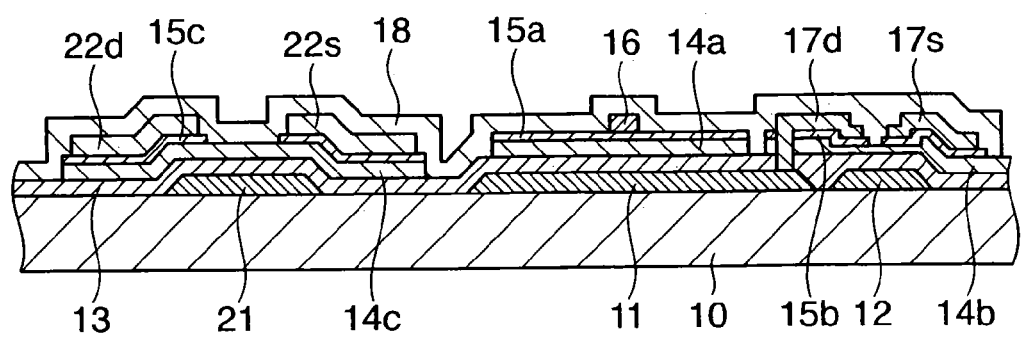

As shown in FIG. 27C, a second insulating film 18 serving as a protective film and having a thickness of 2,000 to 10,000 Å is formed by CVD. As the second insulating film 18, for example, an SiN film can be formed. In this way, the image sensing photoelectric conversion element 1, monitor photoelectric conversion element 2, and TFT 3 can be formed.

A phosphor layer (not shown) is formed. To ensure electrical connection, the protective film at the periphery is removed by patterning and dry etching using photolithography. Thus, a radiation image sensing apparatus can be completed.

(Fifth Embodiment)

The fifth embodiment of the present invention will be described next. In this embodiment, a monitor photoelectric conversion element 2 is arranged near a conversion section T. FIG. 28 is a pseudo equivalent circuit diagram of a TFT matrix panel arranged in a radiation image sensing apparatus according to this embodiment.

This radiation image sensing apparatus has a photoelectric conversion section having, e.g., 12 (rows)×9 (columns) image sensing photoelectric conversion elements 1, and three monitor photoelectric conversion elements 2. Each image sensing photoelectric conversion element 1 is paired with a switching TFT 3 to form one pixel. The sectional structures of the image sensing photoelectric conversion element 1, monitor photoelectric conversion element 2, and switching TFT 3 are the same as in the fourth embodiment.

A control electrode 12 of each image sensing photoelectric conversion element 1 is connected to a gate driver circuit 52 through a corresponding one of gate lines g1 to g12. A source electrode 17s is connected to an image sensing signal processing circuit 51 through a corresponding one of signal lines s1 to s9.

The monitor photoelectric conversion element 2 is, e.g., a TFT sensor. The source electrode 17s of each monitor photoelectric conversion element 2 is connected to a power supply. Drain electrodes 17d are collected to one line and commonly connected to a monitor signal processing circuit 54. The three monitor photoelectric conversion elements 2 are laid out at the left end, central portion, and right end of the substrate, respectively. A control electrode 21 of each monitor photoelectric conversion element 2 is connected to the gate line g12 of the image sensing photoelectric conversion elements 1 on the 12th row.

In the fifth embodiment having the above arrangement, a voltage is applied from a power supply 53 to the source electrode 17s to apply a potential between the source and the drain. Electrons and holes generated when the light-receiving portion between the electrodes is irradiated with light are transported to each electrode by the potential difference between the source and the drain. When the charges are read in real time by the monitor signal processing circuit 54, the light irradiation amount can be monitored. In this monitoring, the depletion voltage of a semiconductor layer, i.e., the OFF voltage of the TFT 3 is applied to the gate line g12 of the 12th row to prevent a dark current and increase the electron/hole collection efficiency. Holes accumulated in the interface between an insulating film 13 and a semiconductor layer 14c in the monitor photoelectric conversion element 2 can be removed by using the operating voltage of the TFT, which is applied to the gate line g12 in reading the charges from the pixels of the 12th row.

Figure 29:
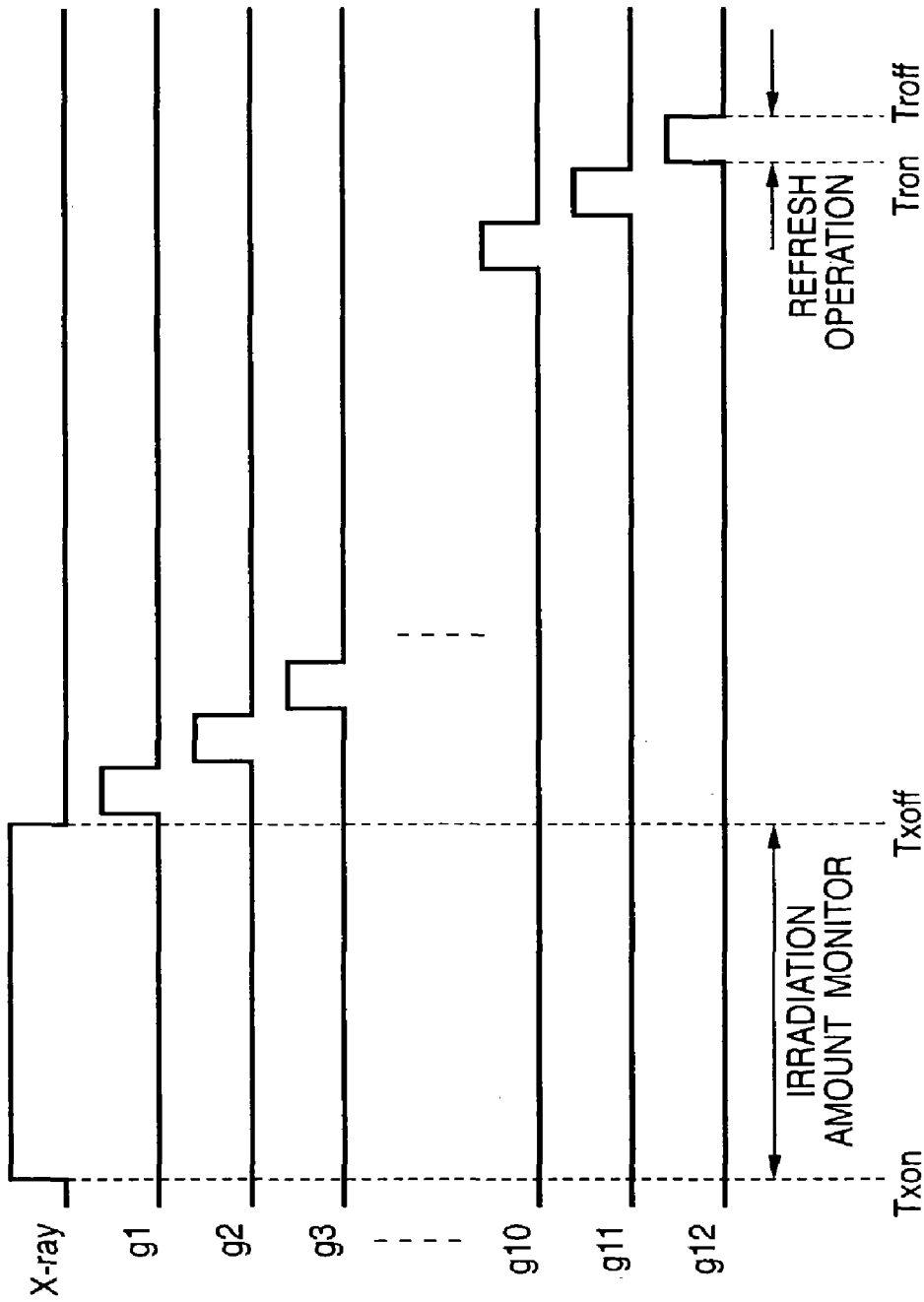
FIG. 29 is a timing chart showing voltages applied from a gate driver circuit 52 to gate lines and the timings of the voltages in the fifth embodiment.

FIG. 29 is a timing chart showing voltages applied from the gate driver circuit 52 to gate lines and the timings of the voltages in the fifth embodiment.

First, the panel is irradiated with radiation from times Txon to Txoff. The radiation is converted into visible light by the phosphor layer formed on the substrate so that the photoelectric conversion elements 1 and 2 are irradiated with the visible light. The visible light with which the photoelectric conversion section is irradiated is absorbed by the image sensing photoelectric conversion elements 1 which are two-dimensionally laid out and stored in the capacitor of each element as charges. The visible light absorbed by each monitor photoelectric conversion element 2 is also converted into charges and transported to the monitor signal processing circuit 54 through the drain electrode 17d. Accordingly, the X-ray dose can be monitored in real time.

When the X-ray dose measured by the monitor signal processing circuit 54 reaches a set value, a signal is sent to the X-ray generator to stop X-ray irradiation. Immediately after that, the operating voltage of the TFT 3 is sequentially applied to the gate lines g1 to g12, thereby reading charges stored in the capacitors of the image sensing photoelectric conversion elements 1 from the signal lines s1 to s9.

In addition, when the operating voltage of the TFT 3 is applied to the gate line g12 (times Tron to Troff), a forward voltage (the operating voltage of the TFT 3) is applied from the three control electrodes 21 connected to the gate line g12 to the semiconductor layer 14c of each monitor photoelectric conversion element 2. For this reason, the charges which are accumulated in the interface between the insulating film 13 and the semiconductor layer 14c in each monitor photoelectric conversion element 2 in correspondence with the X-ray dose are removed (refresh operation).

According to this embodiment, the monitor photoelectric conversion elements 2 themselves and their lead interconnections need not be formed in the photoelectric conversion section. For this reason, in all pixels, the light-receiving area (opening ratio) of the image sensing photoelectric conversion element 1 can be made larger than in the fourth embodiment. In addition, the size of each monitor photoelectric conversion element 2 can be set in accordance with the size of the panel independently of the size of each pixel. For this reason, the light-receiving area (opening ratio) of each monitor photoelectric conversion element 2 can be made larger than in the fourth embodiment.

A method of manufacturing the radiation image sensing apparatus according to this embodiment will be described next. FIGS. 30A to 35B are sectional views showing steps in manufacturing the radiation image sensing apparatus. FIGS. 30A, 31A, 32A, 33A, 34A, and 35A show a portion corresponding to the monitor photoelectric conversion element 2. FIGS. 30B, 31B, 32B, 33B, 34B, and 35B show a portion corresponding to the image sensing photoelectric conversion element 1.

Figure 30B:
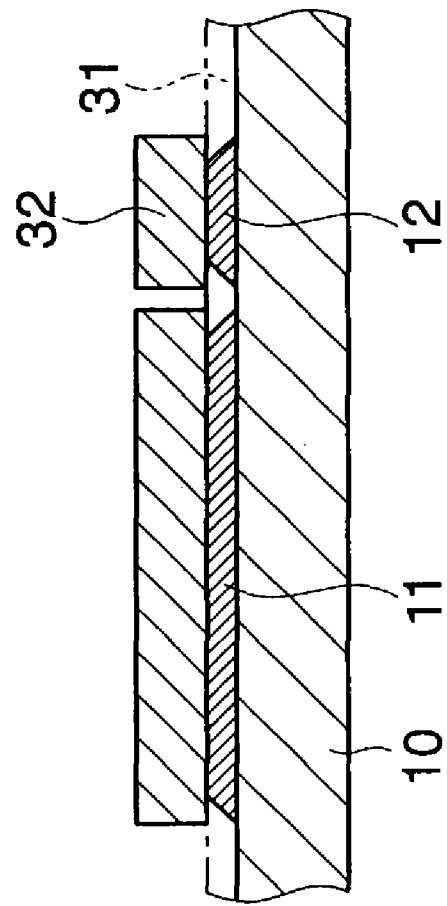
FIGS. 30A and 30B are sectional views showing a method of manufacturing the radiation image sensing apparatus according to the fifth embodiment of the present invention.
Figure 30A:
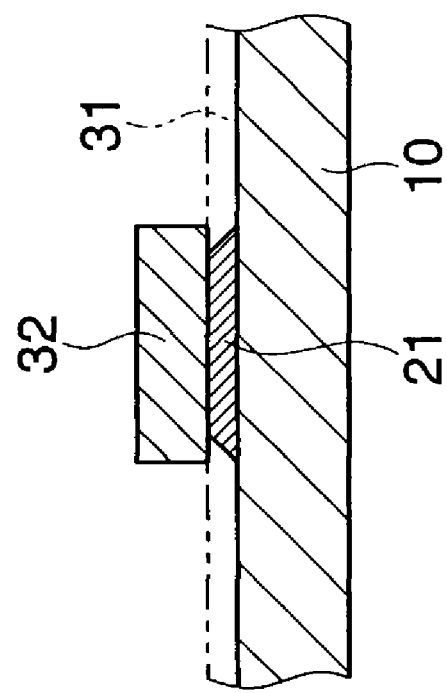

First, as shown in FIGS. 30A and 30B, an AlNd film 31 serving as a first metal layer and having a thickness of 500 to 4,000 Å is formed on an insulating substrate 10 by, e.g., sputtering. An Mo film or Ta film may be formed as the first metal layer. Alternatively, a multilayered film may be formed by sequentially forming a plurality of films. Next, the AlNd film 31 is patterned by photolithography using a resist film 32 as a mask to form a sensor electrode 11, the control electrodes 12 and 21, and a gate line 20. Etching of the AlNd film 31 is done by a wet process using an etchant containing, e.g., nitric acid, phosphoric acid, and acetic acid. After patterning, the resist film 32 is removed.

Figure 31B:
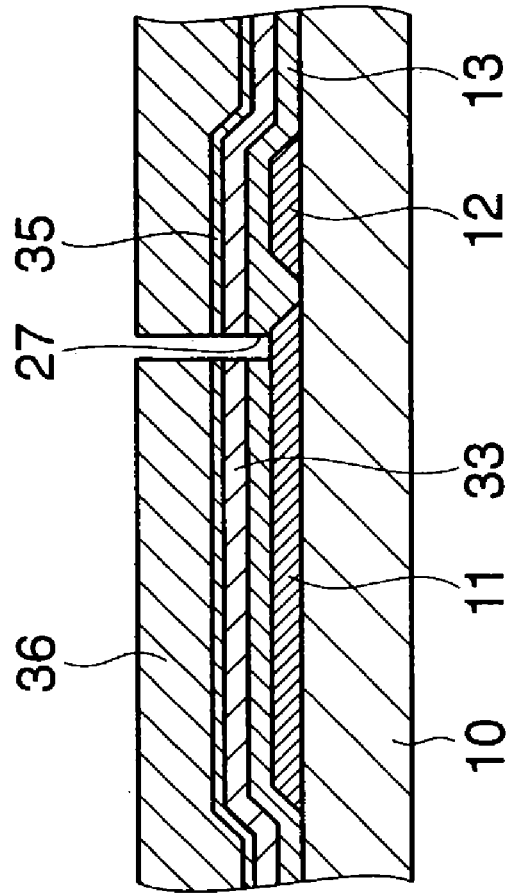
FIGS. 31A and 31B are sectional views showing the method of manufacturing the radiation image sensing apparatus according to the fifth embodiment of the present invention, which show the steps next to those shown in FIGS. 30A and 30B.
Figure 31A:
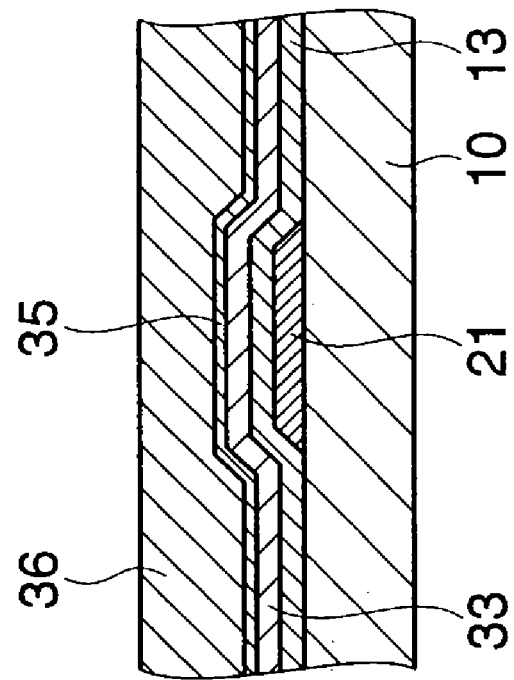

As shown in FIGS. 31A and 31B, the first insulating film 13 having a thickness of 1,500 to 4,000 Å, a semiconductor layer 33 having a thickness of 2,000 to 15,000 Å, and an ohmic contact layer 35 having a thickness of 100 to 1,000 Å are continuously formed by CVD. The semiconductor layer 33 becomes a semiconductor layer (photoelectric conversion layer) 14a of the image sensing photoelectric conversion element 1, a semiconductor layer 14b of the TFT 3, and the semiconductor layer (photoelectric conversion layer) 14c of the monitor photoelectric conversion element 2. As the first insulating film 13, for example, an SiN film is used.

Next, as shown in FIGS. 31A and 31B, a through hole 27 is formed by photolithography using a resist film 36 as a mask. The through hole 27 electrically connects a drain electrode 17d of the TFT 3 to the sensor electrode 11 of the image sensing photoelectric conversion element 1. Charges generated when the light-receiving portion absorbs visible light are read, through the drain electrode 17d, from the sensor electrode 11 capacitively coupled to the light-receiving portion.

To improve the coverage of a metal film to be formed later, chemical dry etching is preferably performed to form a hole having a tapered section. If the coverage of the metal film need not taken into consideration, the process accuracy may be increased by reactive ion etching. Alternatively, the hole may be formed by plasma etching. After patterning, the resist film 36 is removed.

Figure 32A:
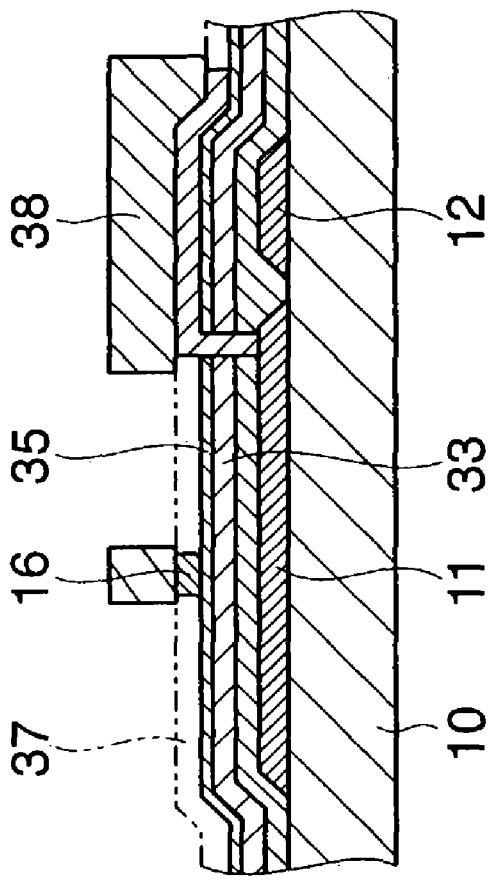
FIGS. 32A and 32B are sectional views showing the method of manufacturing the radiation image sensing apparatus according to the fifth embodiment of the present invention, which show the steps next to those shown in FIGS. 31A and 31B.
Figure 32B:
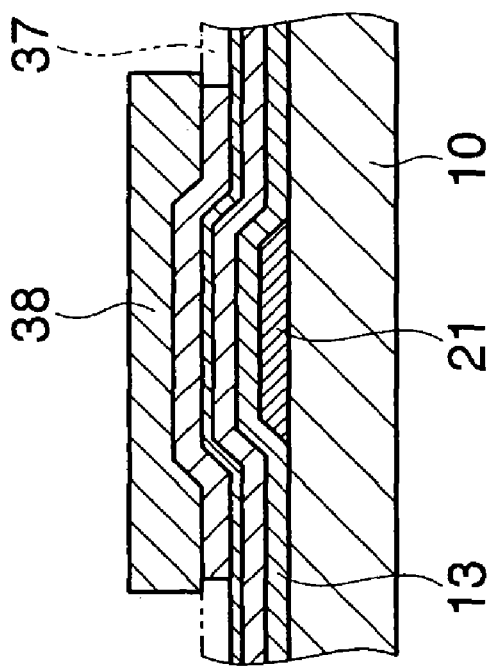

As shown in FIGS. 32A and 32B, an Al film 37 serving as a second metal layer and having a thickness of 1,000 to 4,000 Å is formed by, e.g., sputtering. An Mo film or Ta film may be formed as the second metal layer. Alternatively, a multilayered film may be formed by sequentially forming a plurality of films. If an oxide film is formed on the surface of the through hole 27, and satisfactory connection to the through hole 27 cannot be ensured, a process for removing the oxide film by reverse sputtering is inserted before formation of the Al film 37.

As shown in FIGS. 32A and 32B, the Al film 37 is patterned by photolithography using a resist film 38 as a mask to form a common electrode bias line 16. Etching of the Al film 37 is done by a wet process using an etchant containing, e.g., nitric acid, phosphoric acid, and acetic acid. Hence, the Al film 37 is etched slightly inward under the resist film 38. In this patterning, the Al film 37 in regions where the source electrodes 17s and 22s, drain electrodes 17d and 22d, and signal line 19 are to be formed is masked by the resist film 38 to prevent etching in this process. After patterning, the resist film 38 is removed.

Figure 34B:
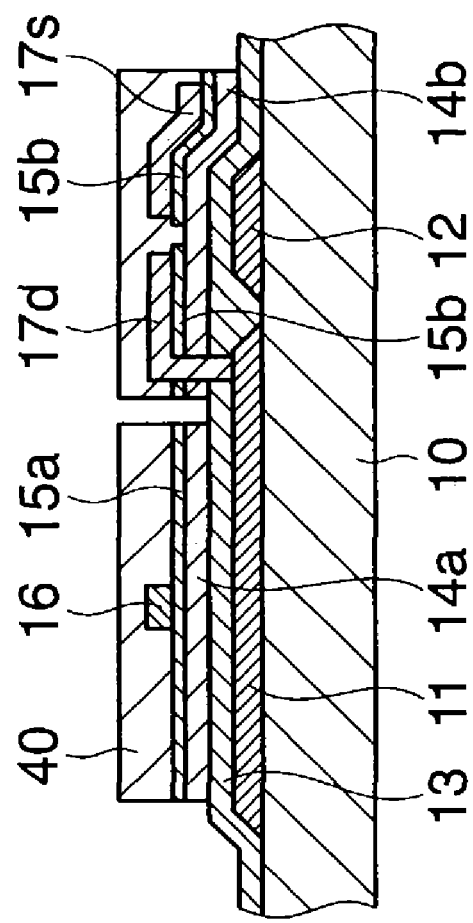
FIGS. 34A and 34B are sectional views showing the method of manufacturing the radiation image sensing apparatus according to the fifth embodiment of the present invention, which show the steps next to those shown in FIGS. 33A and 33B.
Figure 34A:
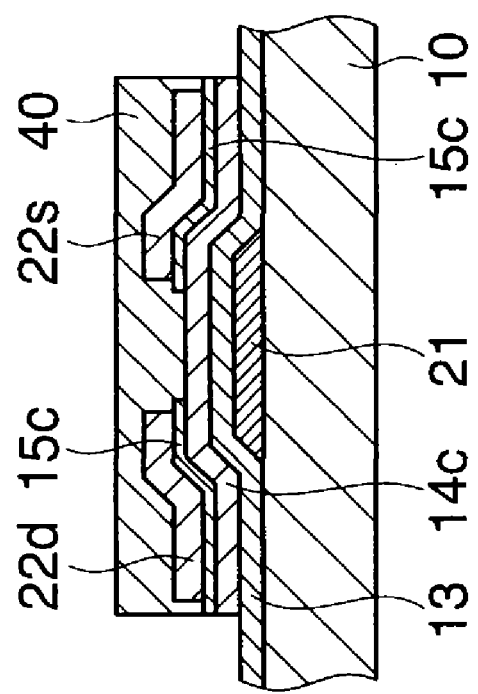

After that, as shown in FIGS. 34A and 34B, the Al film 37 is patterned by photolithography using a new resist film 39 as a mask to form the source electrodes 17s and 22s, drain electrodes 17d and 22d, and signal line 19. Etching of the Al film 37 is done by a wet process using an etchant containing, e.g., nitric acid, phosphoric acid, and acetic acid. Hence, the Al film 37 is etched slightly inward under the resist film 39.

At this time, the common electrode bias line 16 that has already been formed is masked by the resist film 39 to prevent etching in this process. In addition, to prevent the ohmic contact layer 35 in the opening region of the image sensing photoelectric conversion element 1 from being removed by dry etching of the next process, not only the common electrode bias line 16 but also the entire opening region of the image sensing photoelectric conversion element 1 is masked by the resist film 39.

Figure 33B:
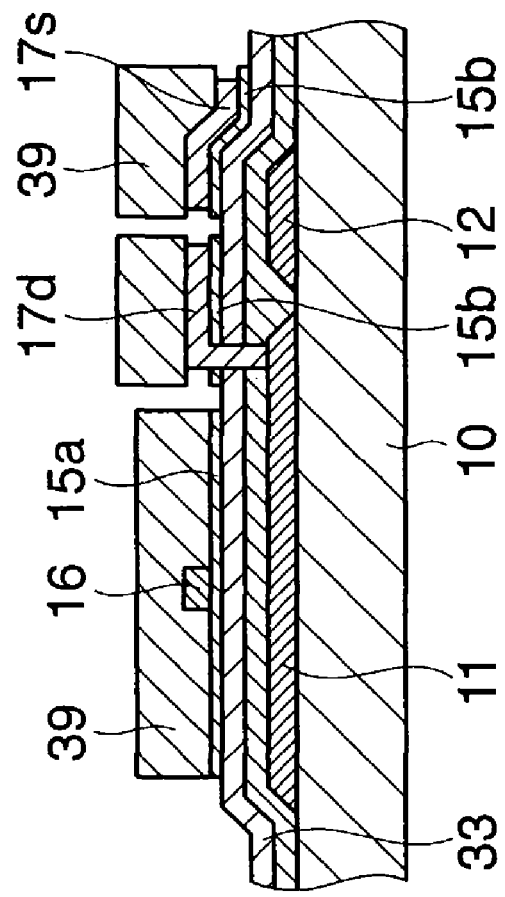
FIGS. 33A and 33B are sectional views showing the method of manufacturing the radiation image sensing apparatus according to the fifth embodiment of the present invention, which show the steps next to those shown in FIGS. 32A and 32B.
Figure 33A:
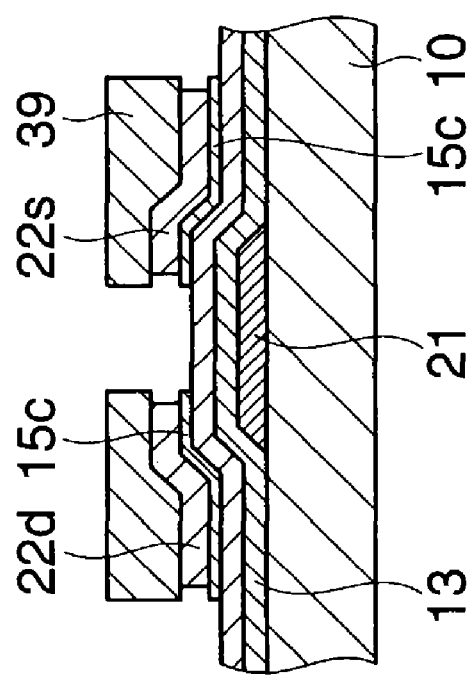

As shown in FIGS. 33A and 33B, dry etching is performed using the resist film 39 as a mask to remove the gap portions of the TFT 3, i.e., the ohmic contact layer 35 between the sources and the drains.

As shown in FIGS. 34A and 34B, unnecessary portions of the semiconductor layer 33 and ohmic contact layer 35 are removed by photolithography using a resist film 40 as a mask to define the opening region of the image sensing photoelectric conversion element 1. After patterning, the resist film 40 is removed.

The unnecessary portions of the first insulating film 13 are not removed in this embodiment. However, they may be removed. When the first insulating film 13 is left without being removed, the etching process for removing the unnecessary portions of the semiconductor layer 33 and ohmic contact layer 35 is preferably executed by using plasma etching in order to ensure the process accuracy because the selectivity ratio between the semiconductor layer 33 and the SiN film that constitutes the first insulating film 13 can readily be ensured in plasma etching.

Figure 35B:
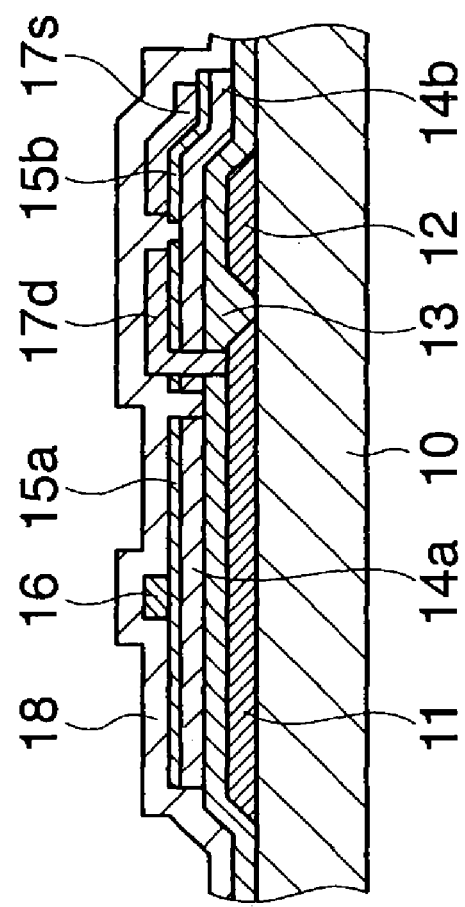
FIGS. 35A and 35B are sectional views showing the method of manufacturing the radiation image sensing apparatus according to the fifth embodiment of the present invention, which show the steps next to those shown in FIGS. 34A and 34B.
Figure 35A:
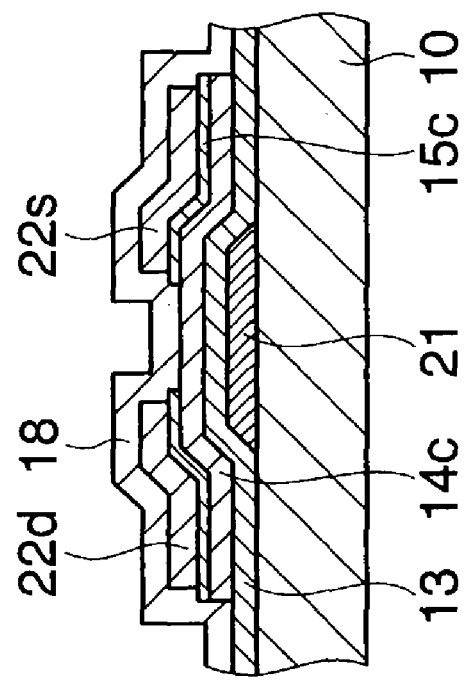
Figure 36:
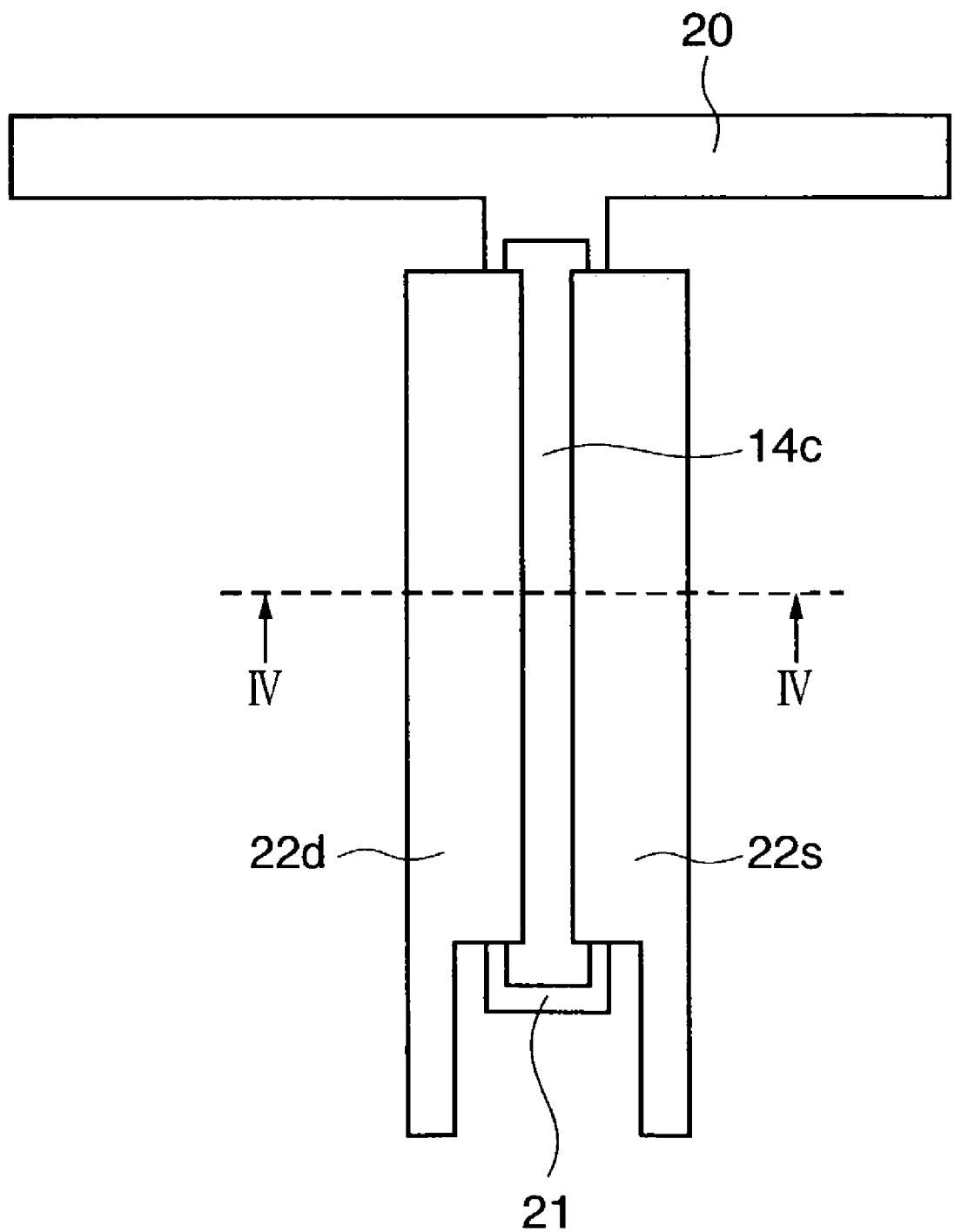
FIG. 36 is a sectional view showing the planar structure of a monitor photoelectric conversion element 2 in the fifth embodiment.

As shown in FIGS. 35A and 35B, a second insulating film 18 serving as a protective film and having a thickness of 2,000 to 10,000 Å is formed by CVD. As the second insulating film 18, for example, an SiN film can be formed. In this way, the image sensing photoelectric conversion element 1, monitor photoelectric conversion element 2, and TFT 3 can be formed. FIG. 36 is a sectional view showing the planar structure of the monitor photoelectric conversion element 2 in this embodiment. FIGS. 30A, 31A, 32A, 33A, 34A, and 35A show a section taken along a line IV—IV in FIG. 36.

A phosphor layer (not shown) is formed. To ensure electrical connection, the protective film at the periphery is removed by patterning and dry etching using photolithography. Thus, a radiation image sensing apparatus can be completed.

In this embodiment, the gate electrode of the monitor photoelectric conversion element 2 is connected to the gate line g12. However, the gate electrode may be connected to a gate line that is connected to the gate driver circuit 52 independently of gate lines g1 to g12. In this case, after the operating voltage is sequentially applied to the gate lines g1 to g12, or simultaneously with application of the operating voltage to the gate line g12, a forward voltage is applied to the semiconductor layer 14c of each monitor photoelectric conversion element 2. With this operation, accumulated charges are removed as the refresh operation.

In this case, the gate driver circuit 52 of the TFT can also be used as the circuit which drives the gate electrode of the monitor photoelectric conversion element 2.

In the above-described method of manufacturing the radiation image sensing apparatus according to the fourth or fifth embodiment, the second metal film is formed after the ohmic contact layer is formed. Before formation of the second metal film, a transparent electrode film made of ITO (Indium—Tin—Oxide) or the like may be formed on the ohmic contact layer. When such a transparent electrode film is formed, no problem is posed even when the ohmic contact layer is thin. For this reason, the ohmic contact layer can be made thin, and accordingly, the incident light amount can be increased. In addition, even in the monitor photoelectric conversion element 2, when the source electrode 22s and drain electrode 22d are formed using by a transparent electrode film, the incident light amount can be increased. Hence, the sensitivity increases.

According to the fourth and fifth embodiments, the second semiconductor conversion element is formed on the same substrate as that of the first semiconductor conversion element. Hence, the entire apparatus can be made compact and lightweight. Additionally, AEC control can be performed on the basis of the radiation amount detected through the second semiconductor conversion element. Since the radiation is not attenuated by the second semiconductor conversion element, an image with a high quality can be obtained.

The present invention is not limited to each of the first to sixth embodiments. The embodiments may be appropriately combined. For example, in the arrangement (first to third embodiments) having an image read sensor stacked on the second conversion element (AEC sensor or radiation monitor sensor), the electrode (the interconnection connected to the electrode) of the second conversion element and the control electrode (the interconnection connected to the electrode) of the switch element may be commonly connected, as described in the fourth and fifth embodiments. According to this arrangement, the interconnection structure becomes simpler. In addition, the light-receiving areas of both of the first conversion element for image reading and the second conversion element for AEC and/or radiation monitor can be increased.

As many apparently widely different embodiments of the present invention can be made without departing from the spirit and scope thereof, it is to be understood that the invention is not limited to the specific embodiments thereof except as defined in the appended claims.

What is claimed is:

1. A radiation imaging apparatus, which comprises conversion means for converting incident radiation into an electrical signal and generates image information on the basis of the electrical signal output from said conversion means, comprising:
   detection means, arranged below said conversion means, for detecting an incident amount of the radiation,
   wherein exposure control for the incident radiation is performed on the basis of a detection result by said detection means, and said conversion means includes a conversion layer, said conversion layer being thinner at a portion above said detection means than at remaining portions.

2. The apparatus according to claim 1, wherein said conversion means comprises a plurality of conversion means, and said detection means is aligned to a gap between said plurality of conversion means.

3. The apparatus according to claim 1, wherein said conversion means is controlled on the basis of the result by said detection means.

4. The apparatus according to claim 1, wherein said conversion means includes a phosphor which converts the incident radiation into visible light and a first conversion element which converts the visible light converted by said phosphor into the electrical signal.

5. The apparatus according to claim 4, wherein said detection means includes a second conversion element which converts visible light converted from the radiation by a phosphor into an electrical signal.

6. The apparatus according to claim 5, wherein said second conversion element comprises a MIS semiconductor conversion element.

7. The apparatus according to claim 4, wherein said detection means is formed below said first conversion element formed in a predetermined closed area.

8. The apparatus according to claim 4, wherein said first conversion element includes a conversion layer, said conversion layer having an opening at a portion above said detection means.

9. The apparatus according to claim 4, wherein said first conversion element comprises a MIS semiconductor conversion element.

10. The apparatus according to claim 4, wherein said first conversion element comprises a PIN semiconductor conversion element.

11. The apparatus according to claim 1, wherein said conversion means includes a first conversion element which converts the incident radiation into the electrical signal.

12. The apparatus according to claim 11, wherein said detection means is formed below said first conversion element formed in a predetermined closed area.

13. The apparatus according to claim 11, wherein said first conversion element includes a conversion layer, said conversion layer having an opening at a portion above said detection means.

14. The apparatus according to claim 11, wherein said first conversion element comprises a MIS semiconductor conversion element.

15. The apparatus according to claim 11, wherein said first conversion element comprises a PIN semiconductor conversion element.

16. The apparatus according to claim 11, wherein said first conversion element contains one of amorphous selenium (a-Se) and gallium arsenide (GaAs).

17. The apparatus according to claim 1, wherein said detection means is formed in the same layer as that of a switching element which switches an output operation of the electrical signal from said conversion means.

18. The apparatus according to claim 1, wherein
said conversion means comprises a plurality of first semiconductor conversion elements which convert the radiation into the electrical signal, and a plurality of thin film transistors connected to said first semiconductor conversion elements, respectively,
said detection means comprises a second semiconductor conversion element of a field effect transistor type, and
a control electrode of said second semiconductor conversion element is connected to a control electrode of at least one thin film transistor selected from said plurality of thin film transistors.

19. A method of driving a radiation imaging apparatus comprising:
a radiation source;
a substrate;
a conversion section which comprises a plurality of first semiconductor conversion elements which are formed on the substrate and convert radiation into an electrical signal, and a plurality of thin film transistors connected to the first semiconductor conversion elements, respectively; and
a second semiconductor conversion element of a field effect transistor type, which is formed on the substrate to detect a total irradiation amount of the radiation that becomes incident on the conversion section and converts the radiation into an electrical signal,
wherein a control electrode of the second semiconductor conversion element is connected to a control electrode of at least one thin film transistor selected from the plurality of thin film transistors, characterized by comprising steps of:
applying an OFF voltage of the thin film transistor to the control electrode of the second semiconductor conversion element to detect the total irradiation amount of the radiation that becomes incident on the conversion section by using the second semiconductor conversion element;
irradiating the conversion section with the radiation from the radiation source;
stopping the irradiation of the conversion section with the radiation from the radiation source when the total irradiation amount reaches a predetermined value;
applying an operating voltage to the control electrode of the thin film transistor to read charges accumulated in the first semiconductor conversion element; and
applying a forward bias to a semiconductor layer of the second semiconductor conversion element to remove charges remaining in the second semiconductor conversion element.

20. The method according to claim 19, wherein part of the step of applying the operating voltage to the control electrode of the thin film transistor and the step of applying the forward bias to the semiconductor layer of the second semiconductor conversion element are simultaneously executed.

* * * * *